(12) United States Patent
Nakamura

(10) Patent No.: US 11,309,415 B2
(45) Date of Patent: Apr. 19, 2022

(54) WIDE GAP SEMICONDUCTOR DEVICE

(71) Applicant: SHINDENGEN ELECTRIC MANUFACTURING CO., LTD., Tokyo (JP)

(72) Inventor: Shunichi Nakamura, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/976,731

(22) PCT Filed: Mar. 29, 2018

(86) PCT No.: PCT/JP2018/013081
§ 371 (c)(1),
(2) Date: Aug. 28, 2020

(87) PCT Pub. No.: WO2019/186853
PCT Pub. Date: Oct. 3, 2019

(65) Prior Publication Data
US 2020/0411680 A1    Dec. 31, 2020

(51) Int. Cl.
*H01L 29/78*    (2006.01)
*H01L 23/522*   (2006.01)
(Continued)

(52) U.S. Cl.
CPC ...... *H01L 29/7804* (2013.01); *H01L 23/5228* (2013.01); *H01L 27/088* (2013.01);
(Continued)

(58) Field of Classification Search
CPC ............. H01L 23/5228; H01L 27/0814; H01L 27/088; H01L 29/7801; H01L 29/7817;
(Continued)

(56) References Cited

U.S. PATENT DOCUMENTS 5,162,966 A     11/1992  Fujihira
6,229,180 B1 *   5/2001  Yoshida ................ H01L 25/071
                                                              257/139
(Continued)

FOREIGN PATENT DOCUMENTS

JP    H02128475 A    5/1990
JP    2000223705 A   8/2000
(Continued)

OTHER PUBLICATIONS

International Search Report in the international application No. PCT/JP18/013081, dated Jun. 19, 2018, and its English translation provided by WIPO.
(Continued)

*Primary Examiner* — Matthew E Warren
(74) *Attorney, Agent, or Firm* — Ladas & Parry, LLP

(57) ABSTRACT

A wide gap semiconductor device has: a first MOSFET region (M0) having a first gate electrode 10 and a first source region 30 provided in a first well region 20 made of a second conductivity type; a second MOSFET region (M1) provided below a gate pad 100 and having a second gate electrode 110 and a second source region 130 provided in a second well region 120 made of the second conductivity type; and a built-in diode region electrically connected to the second gate electrode 110. The second source region 130 of the second MOSFET region (M1) is electrically connected to the gate pad 100.

15 Claims, 52 Drawing Sheets

(51) Int. Cl.
*H01L 27/088* (2006.01)
*H01L 27/08* (2006.01)

(52) U.S. Cl.
CPC ...... *H01L 27/0814* (2013.01); *H01L 29/7801* (2013.01); *H01L 29/782* (2013.01); *H01L 29/7817* (2013.01); *H01L 29/7818* (2013.01); *H01L 29/7819* (2013.01); *H01L 29/7821* (2013.01); *H01L 29/7823* (2013.01); *H01L 29/7826* (2013.01)

(58) Field of Classification Search
CPC ............. H01L 29/7818; H01L 29/7819; H01L 29/782; H01L 29/7821; H01L 29/7823; H01L 29/7826
See application file for complete search history.

(56) References Cited

U.S. PATENT DOCUMENTS

| | | | | |
|---|---|---|---|---|
| 6,268,242 | B1* | 7/2001 | Williams | H03K 17/04123 |
| | | | | 257/331 |
| 2009/0166740 | A1* | 7/2009 | Bhalla | H01L 29/66734 |
| | | | | 257/355 |
| 2010/0187640 | A1 | 7/2010 | Miyata | |
| 2012/0061688 | A1* | 3/2012 | Watanabe | H01L 29/66068 |
| | | | | 257/77 |
| 2015/0206967 | A1* | 7/2015 | Hayashi | H01L 27/0727 |
| | | | | 257/77 |
| 2015/0325691 | A1* | 11/2015 | Miyakoshi | H01L 29/7395 |
| | | | | 257/329 |
| 2018/0040660 | A1 | 2/2018 | Kondo | |
| 2019/0371936 | A1* | 12/2019 | Nagahisa | H01L 29/47 |

FOREIGN PATENT DOCUMENTS

| | | |
|---|---|---|
| WO | 2012001837 A1 | 1/2012 |
| WO | 2016174758 A1 | 11/2016 |

OTHER PUBLICATIONS

Written Opinion of the international application No. PCT/JP18/013081, dated Jun. 19, 2018, and its English translation provided by Google Translate.
Notice of Allowance for Japanese Patent Application 2018-541236, dated Oct. 29, 2019 and translation provided by foreign associate.
Extended European Search Report from EP app. No. 18911364.0, dated Oct. 5, 2021.

* cited by examiner

WIDE GAP SEMICONDUCTOR DEVICE

CROSS-REFERENCE TO RELATED APPLICATION

The present application is the U.S. national phase of PCT Application No. PCT/JP2018/013081 filed on Mar. 29, 2018, the disclosure of which is incorporated herein by reference in its entirety

TECHNICAL FIELD

The present invention relates to a wide gap semiconductor device having: a drift layer of a first conductivity type; a well region made of a second conductivity type and provided in the drift layer; and a source region provided in the well region.

BACKGROUND ART

Conventionally, a MOSFET in a wide gap semiconductor of SiC or the like has been known (WO 2012/001837 A). In such a MOSFET in a wide gap semiconductor of SiC or the like, in a cell part, protection is performed so that an excessive electric field is not applied from a drain side to a gate insulating film. However, when such protection is performed, Crss is generally lowered. It is considered that lowering Crss is preferable in a silicon device, but in a case of a wide gap semiconductor of SiC or the like, RonA is small while a withstand voltage is high. For this reason, lowering Crss causes a state of small Crss and a high withstand voltage, and very high dV/dt is generated at a time of switching. Although high dV/dt is effective in reducing switching loss, excessively high dV/dt causes surge and noise, so that it is necessary to be able to perform control to an appropriate value in accordance with circuit conditions.

Therefore, it is conceivable to use an active mirror circuit or an active clamp circuit for adjusting dV/dt, but an external MOSFET and a diode are required. In a case of a wide gap semiconductor of SiC or the like, there is an advantage that it is possible to use at a high temperature, but it is not possible to use at a high temperature in a case where the MOSFET thus externally attached is made of silicon.

Further, since a wide gap semiconductor of SiC or the like is expensive, separately providing a MOSFET made of a wide gap semiconductor of SiC or the like is to increase a manufacturing cost.

SUMMARY OF INVENTION

Technical Problem

The present invention provides a wide gap semiconductor device capable of adjusting dV/dt while suppressing an increase in a manufacturing cost.

Solution to Problem

Concept 1

A wide gap semiconductor device according to the present invention may comprise:
a drift layer using a wide gap semiconductor material of a first conductivity type;
a source pad;
a first MOSFET region (M0) provided below the source pad and having a first gate electrode and a first source region provided in a first well region made of a second conductivity type;
a gate pad;
a second MOSFET region (M1) provided below the gate pad and having a second gate electrode and a second source region provided in a second well region made of a second conductivity type; and
a built-in diode region electrically connected to the second gate electrode, wherein
the second source region of the second MOSFET region (M1) may be electrically connected to the gate pad.

Concept 2

The wide gap semiconductor device, according to concept 1, may further comprise a third MOSFET region (M5) having a third gate electrode electrically connected to the gate pad and a third source region provided in the second well region.

Concept 3

In the wide gap semiconductor device according to concept 2, the third MOSFET region (M5) may be a planar MOSFET, and the third source region and a third drain region are provided in the second well region.

Concept 4

The wide gap semiconductor device, according to any one of concepts 1 to 3, may further comprise a diode pad connected to the second gate electrode, wherein
the built-in diode region may be electrically connected to the second gate electrode via the diode pad.

Concept 5

In the wide gap semiconductor device according to concept 4, the diode pad and the gate pad may be electrically connected via a resistance part.

Concept 6

In the wide gap semiconductor device according to concept 4 or 5, the built-in diode region may have a third upper well region made of a second conductivity type and provided below the diode pad, and a third lower well region provided below the third upper well region and having an impurity concentration higher than an impurity concentration of the third upper well region.

Concept 7

In the wide gap semiconductor device according to concept 6, the diode pad and the third upper well region may form Schottky junction.

Concept 8

In the wide gap semiconductor device according to any one of concept 1 to 7, in & first well region at least a part of which is provided below the gate pad, a first protection diode region (D6) electrically connected to the source pad and the gate pad may be provided.

Concept 9

The wide gap semiconductor device, according to any one of concepts 1 to 8, may further comprise a diode pad connected to the second gate electrode, wherein in a second well region at least a part of which is provided below the diode pad, a second protection diode region (D7) electrically connected to the diode pad and the gate pad may be provided.

Concept 10

The wide gap semiconductor device, according to any one of concepts 1 to 9, may further comprise a diode pad connected to the second gate electrode, wherein in a first well region at least a part of which is provided below the diode pad, a second protection diode region (D7) electrically connected to the diode pad and the source pad may be provided.

Concept 11

In the wide gap semiconductor device, according to any one of concepts 1 to 10, may further comprise a diode pad connected to the second gate electrode, wherein in a second well region at least a part of which is provided below the diode pad, a resistance region having a low-concentration first conductivity type region electrically connected to the diode pad and the gate pad may be provided.

Concept 12

In the wide gap semiconductor device according to any one of concepts 1 to 11, a first connection region electrically connected to the second gate electrode may be provided below the gate pad.

Concept 13

In the wide gap semiconductor device according to concept 12, the built-in diode region electrically connected to the first connection region may be provided below the first connection region.

Concept 14

In the wide gap semiconductor device according to concept 12 or 13, in a second well region located below the gate pad, a resistance region having a low-concentration first conductivity type region electrically connected to the first connection region and the gate pad may be provided.

Concept 15

In the wide gap semiconductor device according to any one of concepts 12 to 14, a second wiring layer electrically connected to the first connection region and the second gate electrode may be provided between the source pad and the gate pad in an in-plane direction, the built-in diode region may be electrically connected to the second gate electrode via the second wiring layer and the first connection region, and a second protection diode region (D7) electrically connected to the second wiring layer and the source pad may be provided in a first well region at least a part of which is provided below the second wiring layer.

Advantageous Effects of Invention

In the present invention, in a case of adopting an aspect in which a second MOSFET region (M1) is provided below a gate pad, and a diode region (D2$b$+D4) electrically connected to a second gate electrode of the second MOSFET region (M1) is provided, it is possible to provide a wide gap semiconductor device capable of adjusting dV/dt while suppressing an increase in a manufacturing cost.

DESCRIPTION OF EMBODIMENTS

First Embodiment

Figure 1:
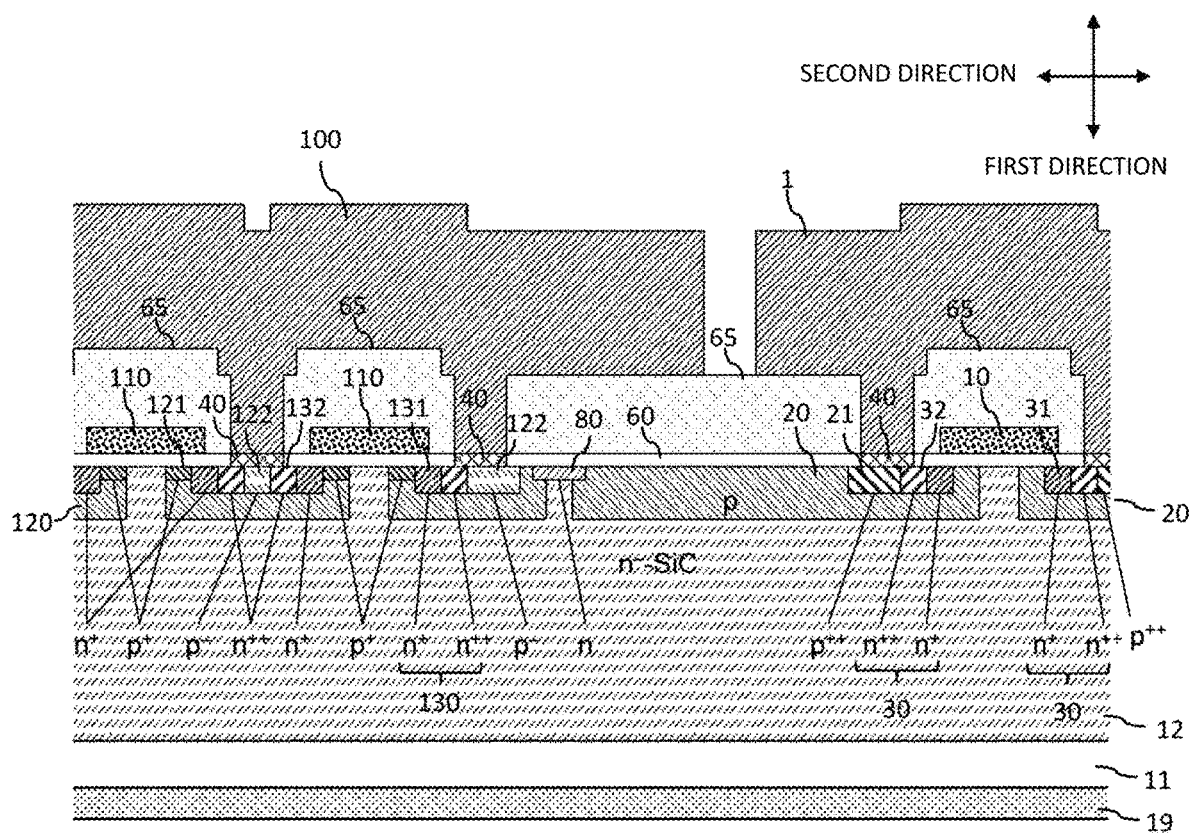
FIG. 1 is a cross-sectional view of a silicon carbide semiconductor device that may be used in a first embodiment of the present invention, taken along virtual line a1 in FIGS. 11 and 12.

In the present embodiment, a description will be given with a vertical MOSFET used as an example. In the present embodiment, a description will be given with a first conductivity type as n-type, and a second conductivity type as p-type. However, the present invention is not limited to such an aspect, and the first conductivity type may be p-type, and the second conductivity type may be n-type. Further, in the present embodiment, a description will be given with silicon carbide used for a wide gap semiconductor. However, the present invention is not limited to such an aspect, and gallium nitride or the like may be used for the wide gap semiconductor. In the present embodiment, a vertical direction, which is a thickness direction, is shown as a first direction in FIG. 1. A direction orthogonal to the thickness direction (first direction) in FIG. 1 is referred to as an "in-plane direction". That is, a plane including a horizontal direction (second direction) in FIG. 1 and a normal direction of the page is the "in-plane direction".

As shown in FIG. 1, a silicon carbide semiconductor device of the present embodiment may have: an n-type silicon carbide semiconductor substrate 11; a drift layer 12 provided on a first main surface (upper surface) of the silicon carbide semiconductor substrate 11 and using an n-type silicon carbide material; a plurality of p-type well regions 20 provided in the drift layer 12; and an n-type source region 30 provided in the well region 20. The well region 20 may be formed, for example, by implanting a p-type impurity into the drift layer 12, and the source region 30 may be formed, for example, by implanting an n-type impurity into the well region 20. On a second main surface (lower surface) of the silicon carbide semiconductor substrate 11, a drain electrode 19 may be provided. Outside a periphery of a region used as a cell, a withstand voltage structure part may be provided. As the drain electrode 90, for example, titanium, aluminum, nickel, or the like may be used. An impurity concentration in the drift layer 12 of the present embodiment is, for example, $1\times10^{14}$ to $4\times10^{16}$ cm$^{-3}$, and an impurity concentration in the silicon carbide semiconductor substrate 11 is, for example, $1\times10^{18}$ to $3\times10^{19}$ cm$^{-3}$.

Figure 2:
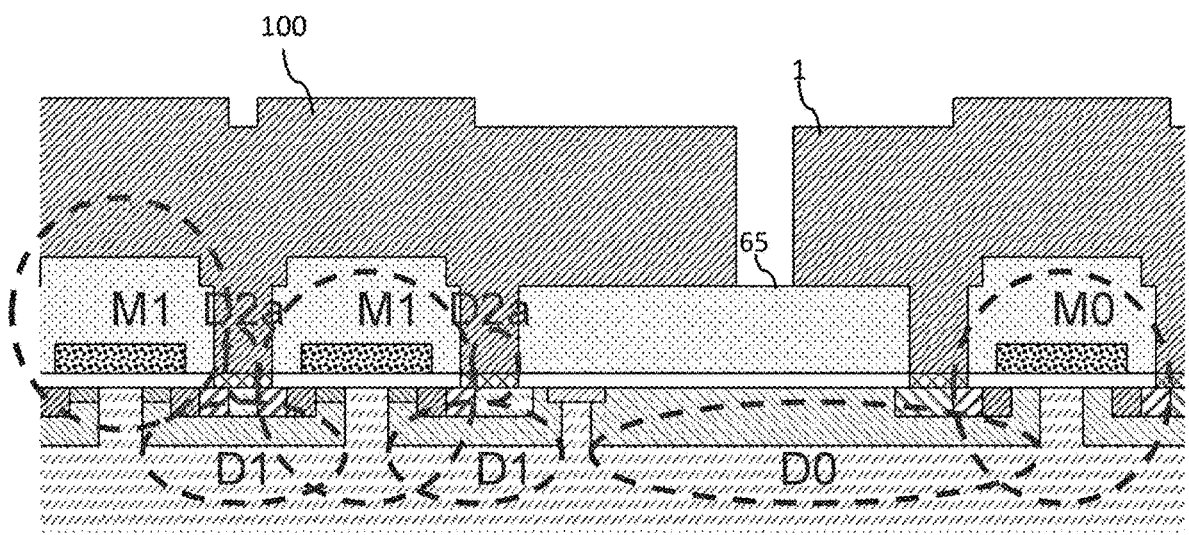
FIG. 2 is a view for explaining a function of a layer in the cross section shown in FIG. 1.

As shown in FIGS. 1 and 2, the silicon carbide semiconductor device may have a source pad 1; and a first MOSFET region (M0) having a first gate electrode 10 provided below the source pad 1 and made of polysilicon or the like, and a first source region 30 provided in a first well region 20 made of the second conductivity type. An upper surface and a side surface of the first gate electrode 10 may be surrounded by an interlayer insulating film 65, and a lower surface of the first gate electrode 10 may be provided with a first insulating film 60 made of a gate oxide film or the like (see virtual line a1 in FIGS. 11 and 12).

In the first source region 30, a location connected to the source pad 1 may be an ultra-high-concentration n-type region (n$^{++}$) 32, and a high-concentration n-type region (n$^{+}$) 31 may be provided adjacent to the ultra-high-concentration n-type region 32. Adjacent to the ultra-high-concentration n-type region 32, an ultra-high-concentration p-type semiconductor region (p$^{++}$) 21 may be provided. The ultra-high-concentration n-type region 32 and the ultra-high-concentration p-type semiconductor region 21 may be connected to the source pad 1 via a metal layer 40. The first insulating film 60 may be provided also between the first well region 20 and the interlayer insulating film 65.

The silicon carbide semiconductor device may have: a gate pad 100; and a second MOSFET region (M1) having a second gate electrode 110 provided below the gate pad 100 and made of polysilicon or the like, and a second source region 130 provided in a second well region 120 made of the second conductivity type. An upper surface and a side surface of the second gate electrode 110 may be surrounded by the interlayer insulating film 65, and a lower surface of the second gate electrode 110 may be provided with the first insulating film 60 made of a gate oxide film or the like.

The second source region 130 may have: a high-concentration n-type region (n$^{+}$) 131 located partially below the second gate electrode 110; and an ultra-high-concentration n-type region (n$^{++}$) 132 adjacent to the high-concentration n-type region 131. In the second well region 120, a region adjacent to the ultra-high-concentration n-type region 132 may be a low-concentration p-type region (p$^{-}$) 122, and a region between the high-concentration n-type region 131 and the drift layer 12 may be a high-concentration p-type region (p$^{+}$) 121. The ultra-high-concentration n-type region (n$^{++}$) and the low-concentration p-type region (p$^{-}$) may be connected to the gate pad 100 via the metal layer 40. The metal layer 40 below the gate pad 100 and the low-concentration p-type region (p$^{-}$) of the second well region 120 may form Schottky junction.

The first well region 20 and the second well region 120 described above may be formed by separating a well region by providing a first isolation region 90 made of an n-type region (n) between the first source region 30 and the second source region 130 in an in-plane direction.

Figure 3:
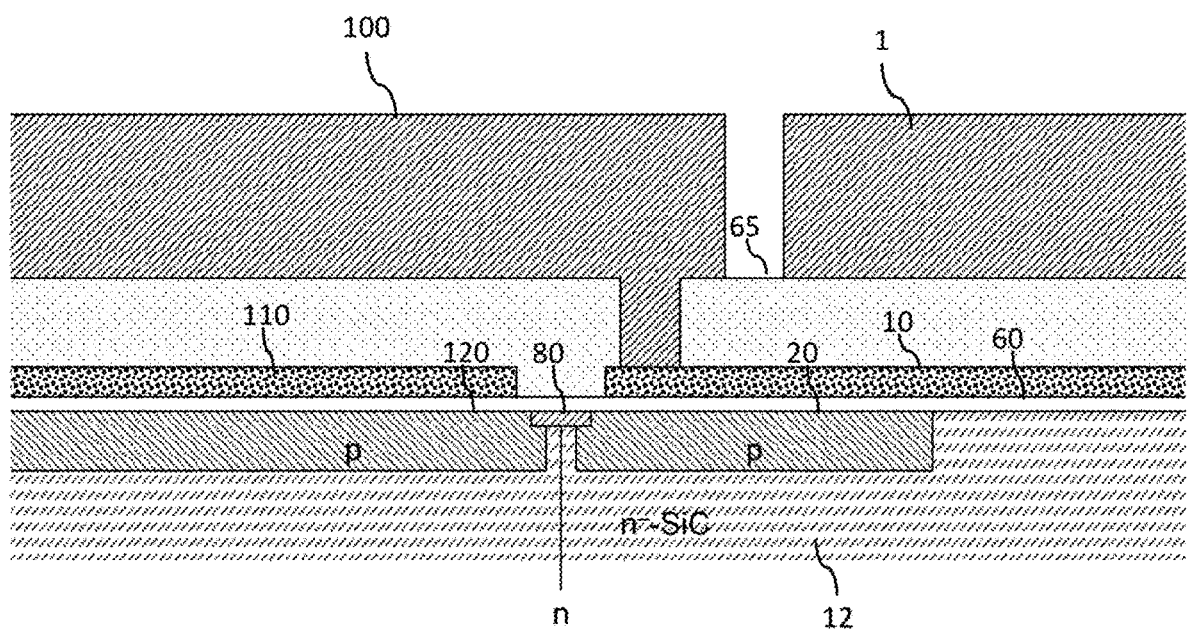
FIG. 3 is a cross-sectional view of a silicon carbide semiconductor device that may be used in the first embodiment of the present invention, taken along virtual line b1 in FIGS. 11 and 12.
Figure 4:
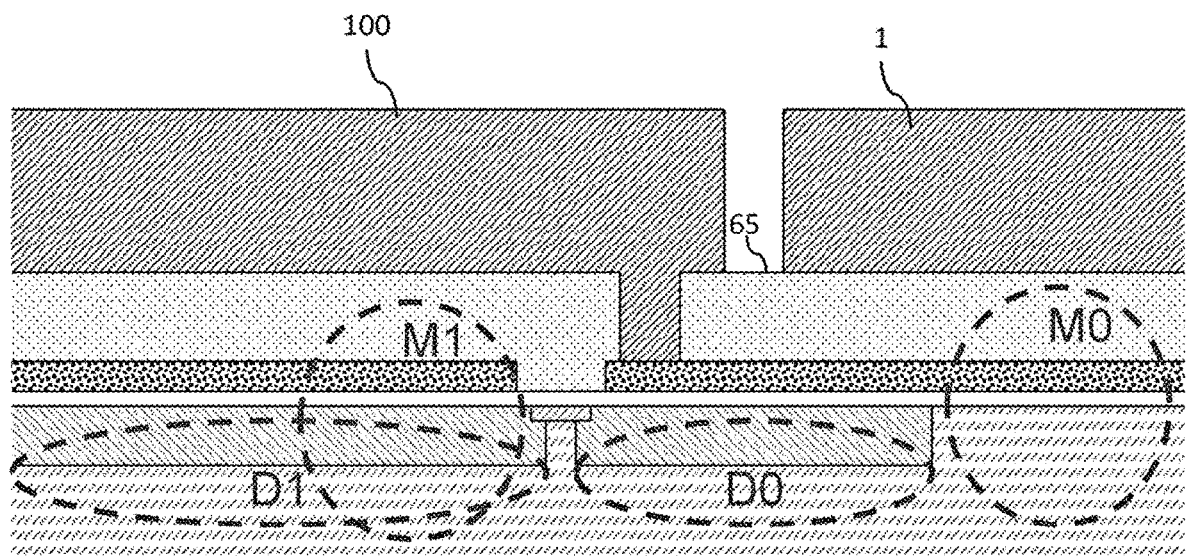
FIG. 4 is a view for explaining a function of a layer in the cross section shown in FIG. 3.

As shown in FIGS. 3 and 4, at a location different from a location where the first MOSFET region (M0) exists (see virtual line b1 in FIGS. 11 and 12), the gate pad 100 may be connected to the first gate electrode 10 to form a gate connection region. The gate connection region may be formed by contact between the first gate electrode 10 and the gate pad 100 via a gate contact hole provided in the interlayer insulating film 65.

Figure 5:
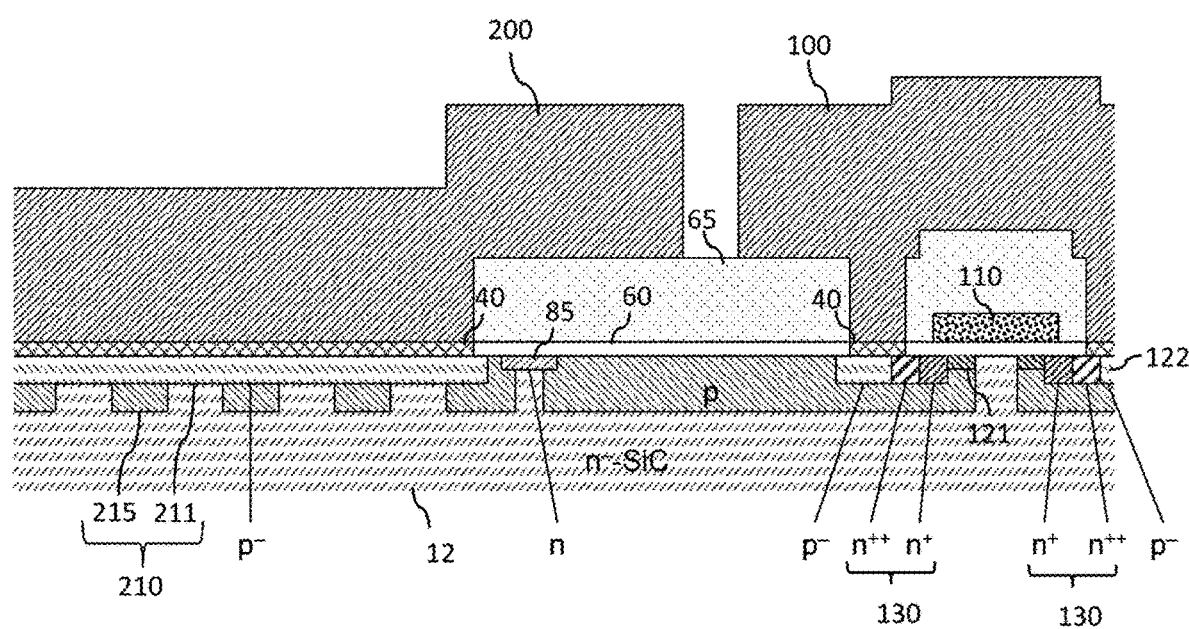
FIG. 5 is a cross-sectional view of a silicon carbide semiconductor device that may be used in the first embodiment of the present invention, taken along virtual line c1 in FIGS. 11 and 14.
Figure 6:
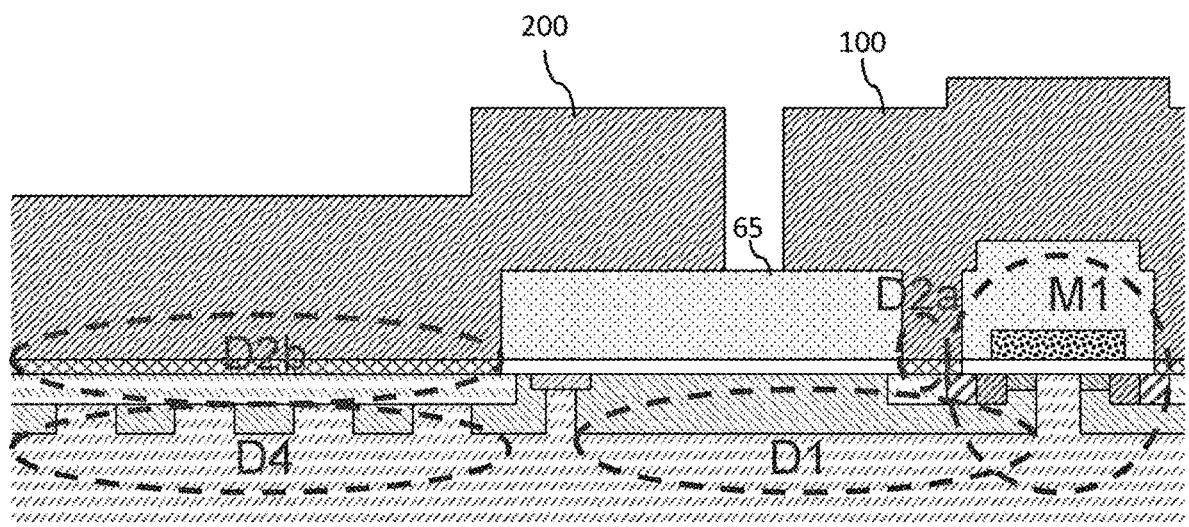
FIG. 6 is a view for explaining a function of a layer in the cross section shown in FIG. 5.
Figure 11:
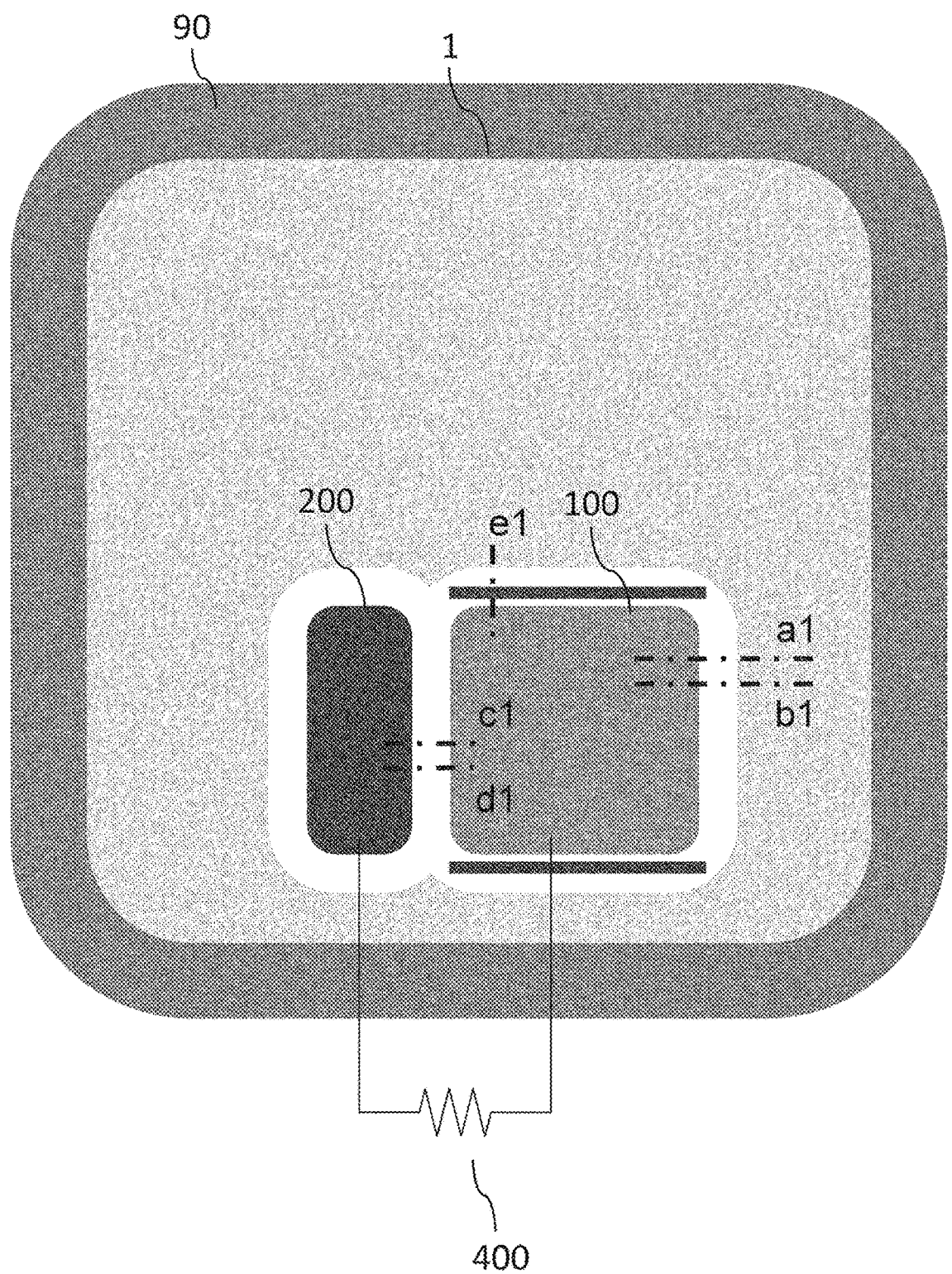
FIG. 11 is a schematic plan view of a silicon carbide semiconductor device that may be used in the first embodiment of the present invention.
Figure 14:
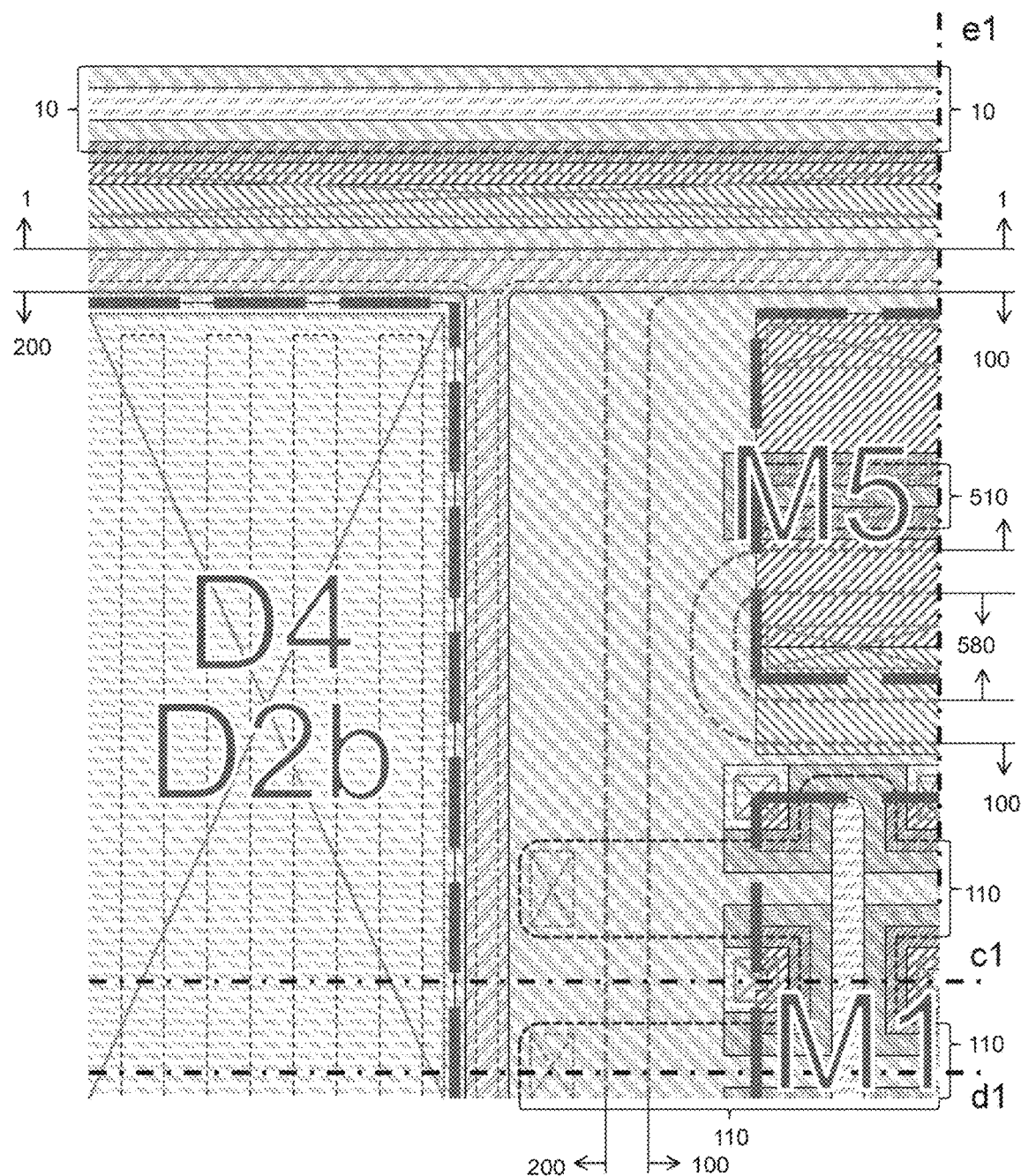
FIG. 14 is a plan view showing an aspect of a silicon carbide semiconductor device that may be used in the first embodiment of the present invention at a different location from FIGS. 12 and 13.

As shown in FIGS. 5 and 6, between the gate pad 100 and the source pad 1 in the in-plane direction, a first built-in diode region (D2b+D4) may be provided (see virtual line c1 in FIGS. 11 and 14). This first built-in diode region (D2b+D4) may be connected to the gate pad 100 via a diode pad 200 made of aluminum or the like and an external resistance part 400 (see FIG. 11).

The first built-in diode region (D2b+D4) may have a third well region 210. The third well region 210 may have: a p-type third upper well region 211 provided below the diode pad 200; and a third lower well region 215 provided below the third upper well region 211 and having a higher impurity concentration than that of the third upper well region 211. The third upper well region 211 and the diode pad 200 may be connected via the metal layer 40. The third lower well region 215 may be provided in a stripe shape below the third upper well region 211.

Figure 7:
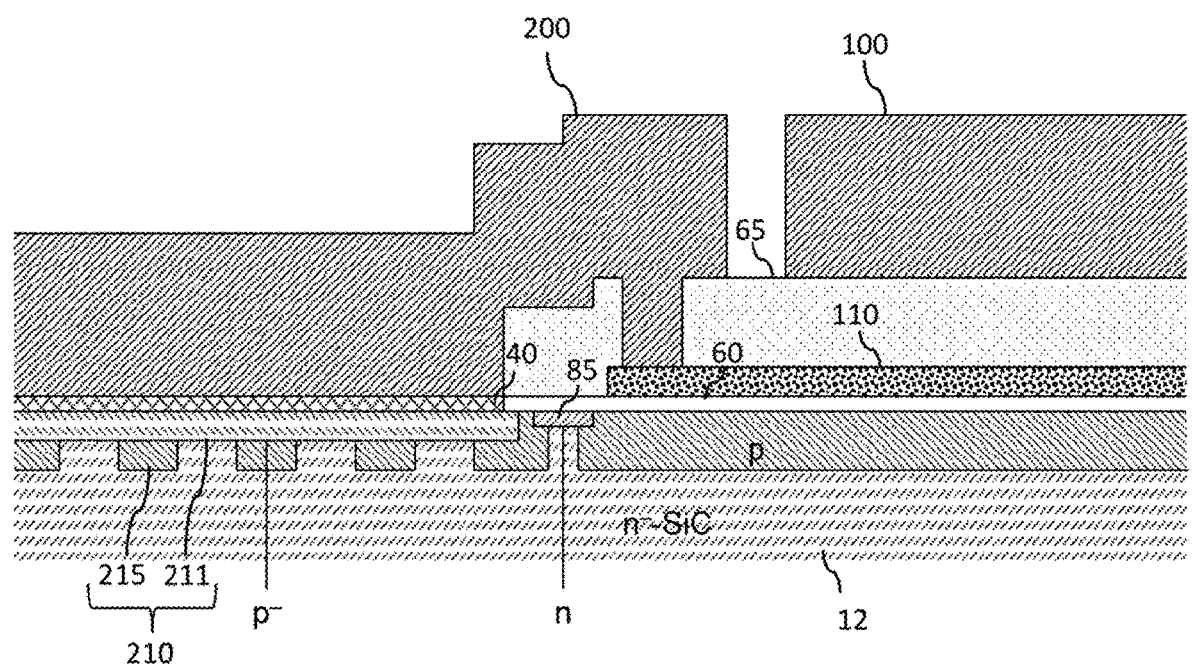
FIG. 7 is a cross-sectional view of a silicon carbide semiconductor device that may be used in the first embodiment of the present invention, taken along virtual line d1 in FIGS. 11 and 14.
Figure 8:
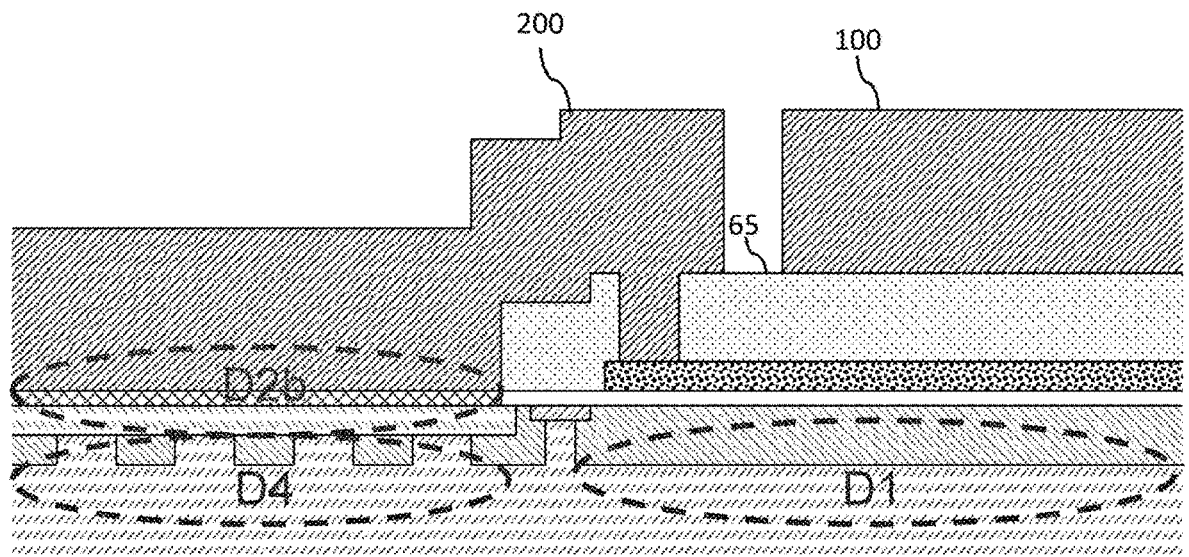
FIG. 8 is a view for explaining a function of a layer in the cross section shown in FIG. 7.
Figure 9:
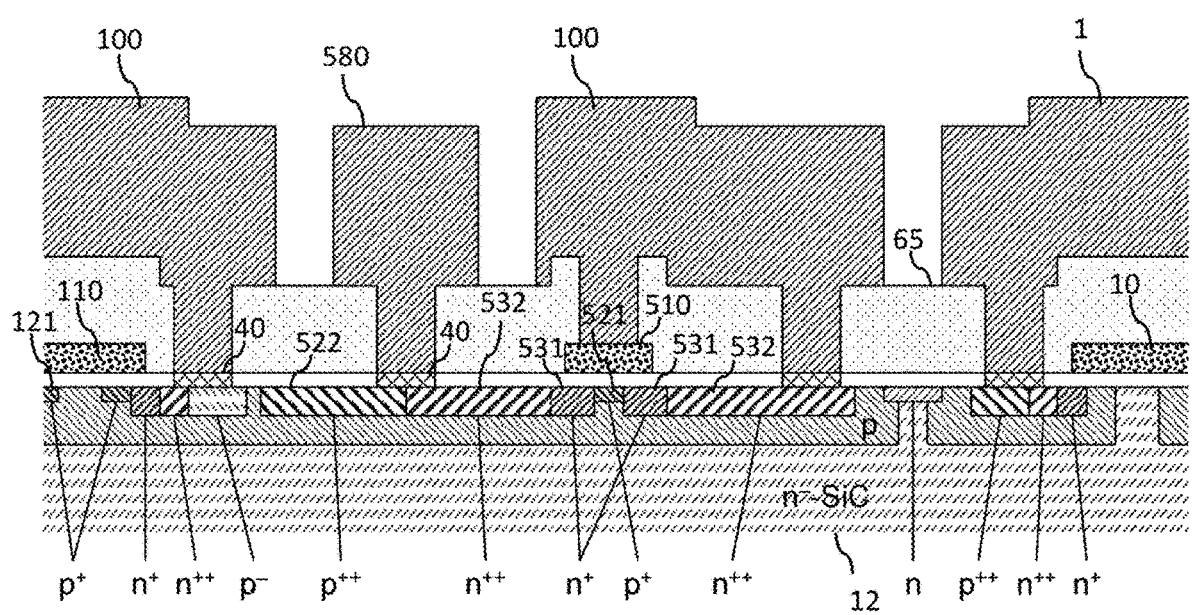
FIG. 9 is a cross-sectional view of a silicon carbide semiconductor device that may be used in the first embodiment of the present invention, taken along virtual line e1 in FIGS. 11, 12, and 14.

As shown in FIGS. 5 and 6, the third lower well region 215 may be configured to surround a periphery of the third upper well region 211. By providing a second isolation region 85 made of an n-type region (n) between the third lower well region 215 and the second well region 120 in the in-plane direction, these may be separated. As shown in FIGS. 7 and 9, the second gate electrode 110 and the diode pad 200 may be connected.

The third upper well region 211 may be made of a low-concentration p-type region (p$^{-}$), and the metal layer 40 connected to the diode pad 200 and the third upper well region 211 may form Schottky junction. The third lower well region 215 may be made of a p-type region (p).

Figure 10:
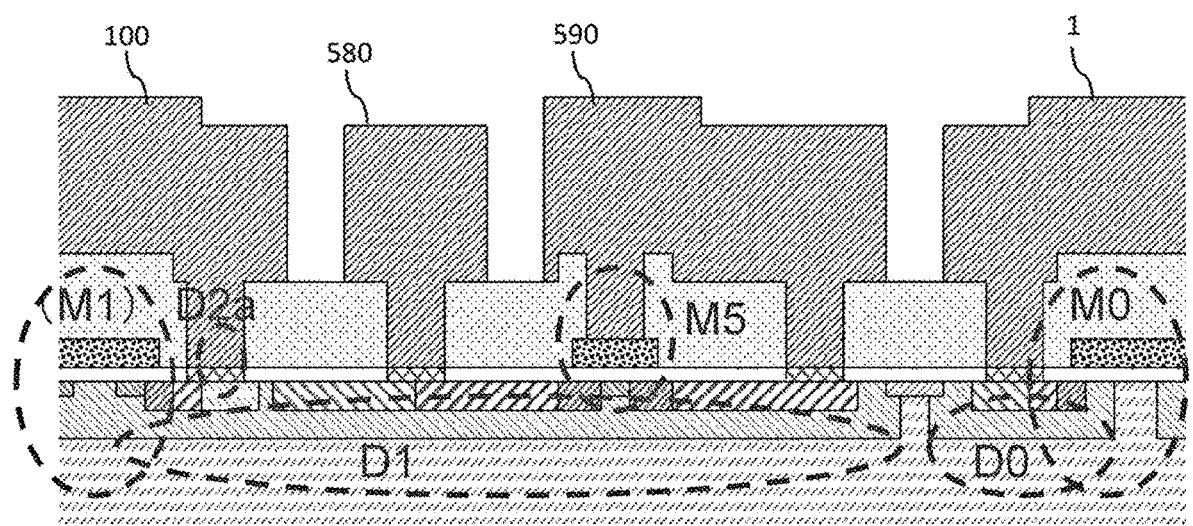
FIG. 10 is a view for explaining a function of a layer in the cross section shown in FIG. 9.
Figure 12:
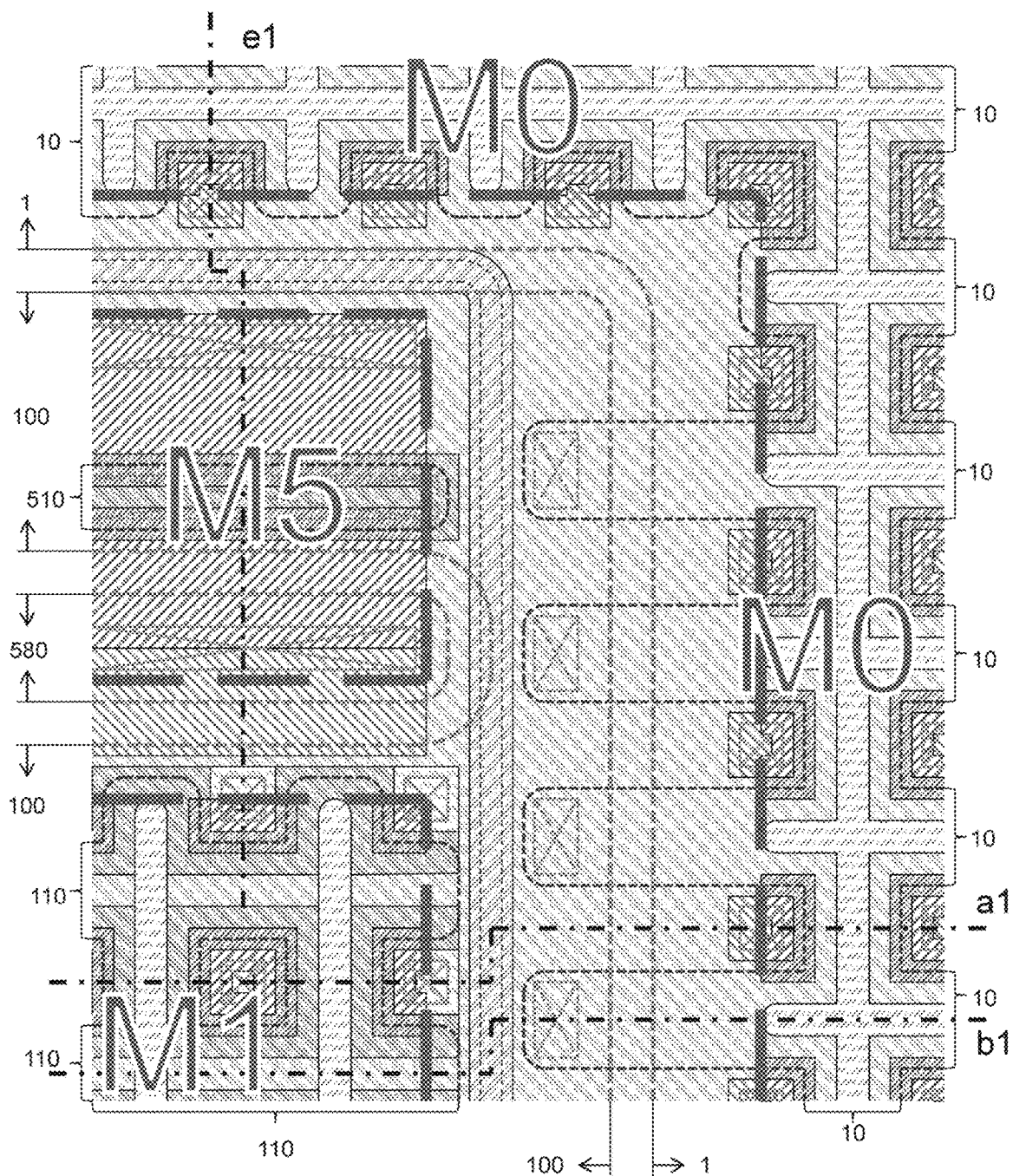
FIG. 12 is a plan view showing one aspect of a silicon carbide semiconductor device that may be used in the first embodiment of the present invention.

As shown in FIGS. 9 and 10, a third MOSFET region (M5) may be provided at a peripheral part of the gate pad 100 in the in-plane direction (see virtual line e1 in FIGS. 11, 12, and 14). The third MOSFET region (M5) may have a third gate electrode 510 electrically connected to the gate pad 100, and a third source region provided in the second well region 120. The third MOSFET region (M5) may be a planar MOSFET, and the third source region and a third drain region may be provided in the second well region 120.

Specifically, a pair of high-concentration n-type regions (n$^{+}$) 531 located partially below the third gate electrode 510; and a pair of ultra-high-concentration n-type regions (n$^{++}$) 532 adjacent to the high-concentration n-type regions 531 may be provided. Between the pair of high-concentration n-type regions 531 in the second well region 120, a high-concentration p-type region (p$^{+}$) 521 may be provided. Then, the third source region may be formed by the high-concentration n-type region 531 and the ultra-high-concentration n-type region 532 on one side (a right side in FIGS. 9 and 10), and the third drain region may be formed by the high-concentration n-type region 531 and the ultra-high-concentration n-type region 532 on another side (a left side in FIGS. 9 and 10). In an aspect shown in FIGS. 9 and 10, the third gate electrode 510 and the third source region are connected by the gate pad 100.

In the second well region 120, adjacent to the ultra-high-concentration n-type region 532 on the second MOSFET region (M1) side, an ultra-high-concentration p-type region ($p^{++}$) 522 may be provided. The ultra-high-concentration n-type region ($n^{++}$) and the ultra-high-concentration p-type region ($p^{++}$) may be connected to a first wiring layer 590 made of aluminum or the like via the metal layer 40. This first wiring layer 590 need not be connected to any other than the ultra-high-concentration n-type region ($n^{++}$) and the ultra-high-concentration p-type region ($p^{++}$). By providing the first wiring layer 580, the ultra-high-concentration n-type region ($n^{++}$) and the ultra-high-concentration p-type region ($p^{++}$) can be short-circuited.

The gate electrodes such as the first gate electrode 10, the second gate electrode 110, and the third gate electrode 510 may be formed of, for example, polysilicon, and may be formed using a CVD method, a photolithography technique, or the like. The interlayer insulating film 65 may be formed of, for example, silicon dioxide, and may be formed by a CVD method or the like.

The metal layer 40 may be provided with a metal layer 40 made of nickel, titanium, or an alloy containing nickel or titanium.

As shown in FIG. 11, outside a periphery of the source pad 1, a withstand voltage structure 90 such as a guard ring may be provided so as to entirely surround the source pad 1.

Figure 13:
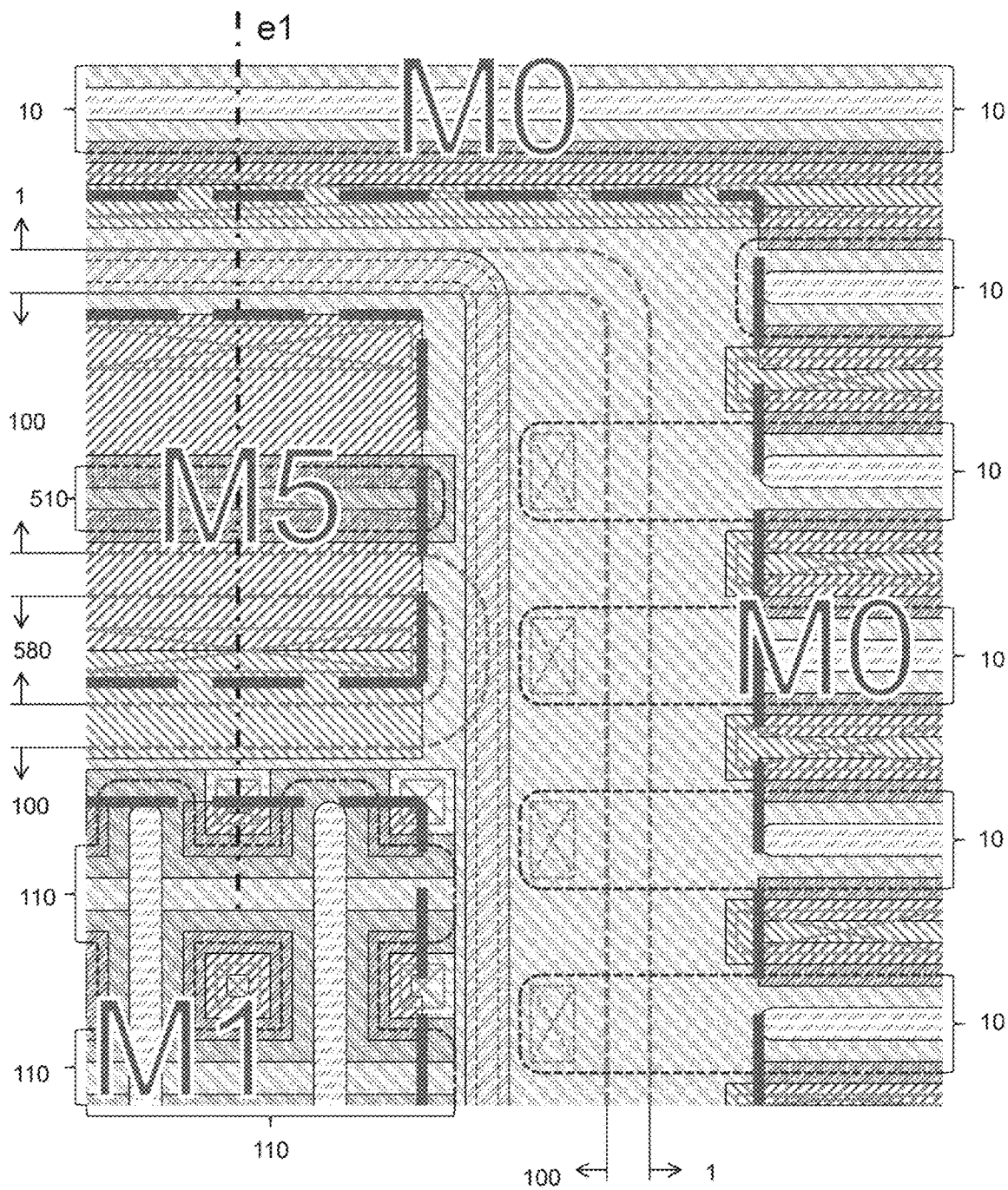
FIG. 13 is a plan view showing another aspect of a silicon carbide semiconductor device that may be used in the first embodiment of the present invention.

Cells of the first MOSFET region (M0) may have a substantially rectangular shape (square cell) in the in-plane direction as shown in FIG. 12, or may have a stripe shape (stripe cell) as shown in FIG. 13. The second MOSFET region (M1) may have a substantially rectangular shape (square cell) in the in-plane direction as shown in FIGS. 12 and 13, or may have a stripe shape (stripe cell) without limiting to this. When the second MOSFET region (M1) has a substantially rectangular shape (square cell) in the in-plane direction, the second well region 120 may be connected below the second MOSFET region (M1) as shown in FIGS. 3 and 4 in order to prevent floating of a potential of the second well region 120.

In the present embodiment, an impurity concentration of the ultra-high-concentration n-type region ($n^{++}$) is, for example, $2 \times 10^{19}$ to $1 \times 10^{21}$ cm$^{-3}$, an impurity concentration of the high-concentration n-type region ($n^+$) is, for example, $1 \times 10^{18}$ to $2 \times 10^{19}$ cm$^{-3}$, an impurity concentration of the n-type region (n) is, for example, $4 \times 10^{16}$ to $1 \times 10^{18}$ cm$^{-3}$, and an impurity concentration of a low-concentration n-type region ($n^-$) described later is, for example, $1 \times 10^{14}$ to $4 \times 10^{16}$ cm$^{-3}$. An impurity concentration of the ultra-high-concentration p-type semiconductor region ($p^{++}$) is, for example, $2 \times 10^{19}$ to $1 \times 10^{21}$ cm$^{-3}$, an impurity concentration of the high-concentration p-type region ($p^+$) is, for example, $3 \times 10^{17}$ to $1 \times 10^{19}$ cm$^{-3}$, an impurity concentration of the p-type region (p) is, for example, $1 \times 10^{17}$ to $5 \times 10^{18}$ cm$^{-3}$, which is lower than the impurity concentration of the high-concentration p-type region ($p^+$), and an impurity concentration of the low-concentration p-type region ($p^-$) is, for example, $1 \times 10^{16}$ to $1 \times 10^{17}$ cm$^{-3}$.

In the present embodiment, in a case of adopting an aspect in which the second MOSFET region (M1) is provided below the gate pad 100, and the first built-in diode region (D2b+D4) electrically connected to the second gate electrode 110 of the second MOSFET region (M1) is provided, it is possible to adjust dV/dt while suppressing an increase in manufacturing cost, since it is not necessary to separately provide a MOSFET made of a wide gap semiconductor of SiC or the like.

Figure 15:
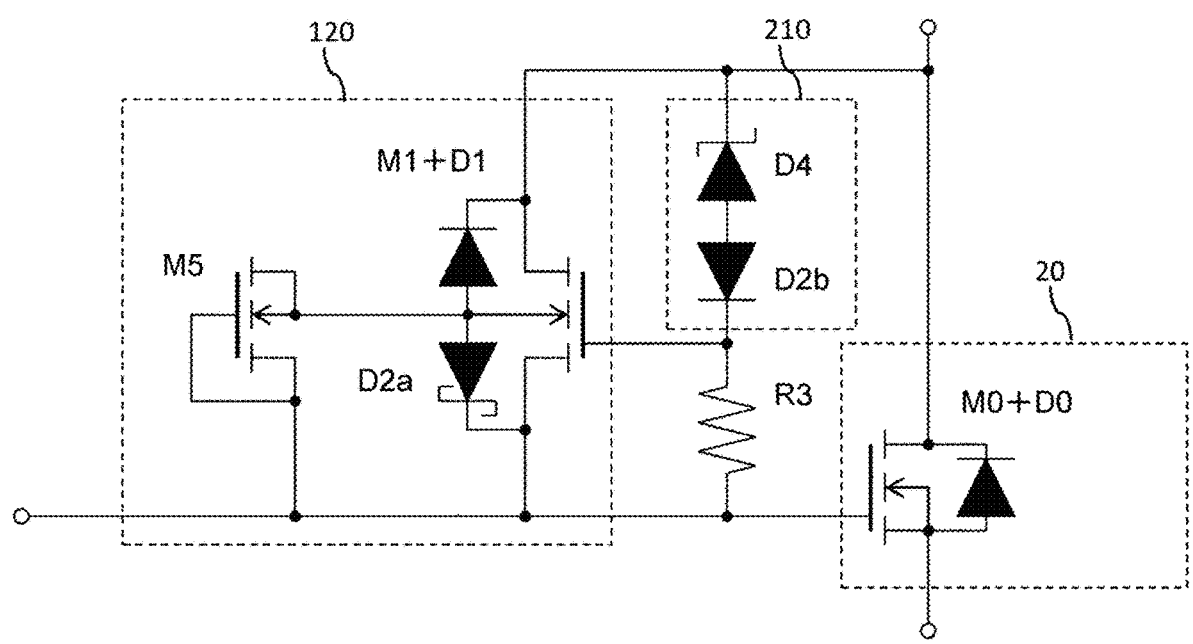
FIG. 15 is a circuit diagram of a silicon carbide semiconductor device that may be used in the first embodiment of the present invention.

According to the present embodiment, a circuit configuration is to be as shown in FIG. 15, and a mirror circuit using the first MOSFET region (M0) and the second MOSFET region (M1) can also be adopted.

Note that, in FIG. 15, parts surrounded by broken lines are separate well regions. When the second well region 120 of the second MOSFET region (M1) is negatively biased, there is a possibility that the second MOSFET region becomes normally on. However, by providing the third MOSFET region (M5) having the second well region 120 as shown in FIG. 15, it is possible to turn on the third MOSFET region (M5) before the second MOSFET region becomes normally on due to a substrate bias effect, and zero bias can be obtained again.

Second Embodiment

Hereinafter, a second embodiment of the present invention will be described.

Figure 16:
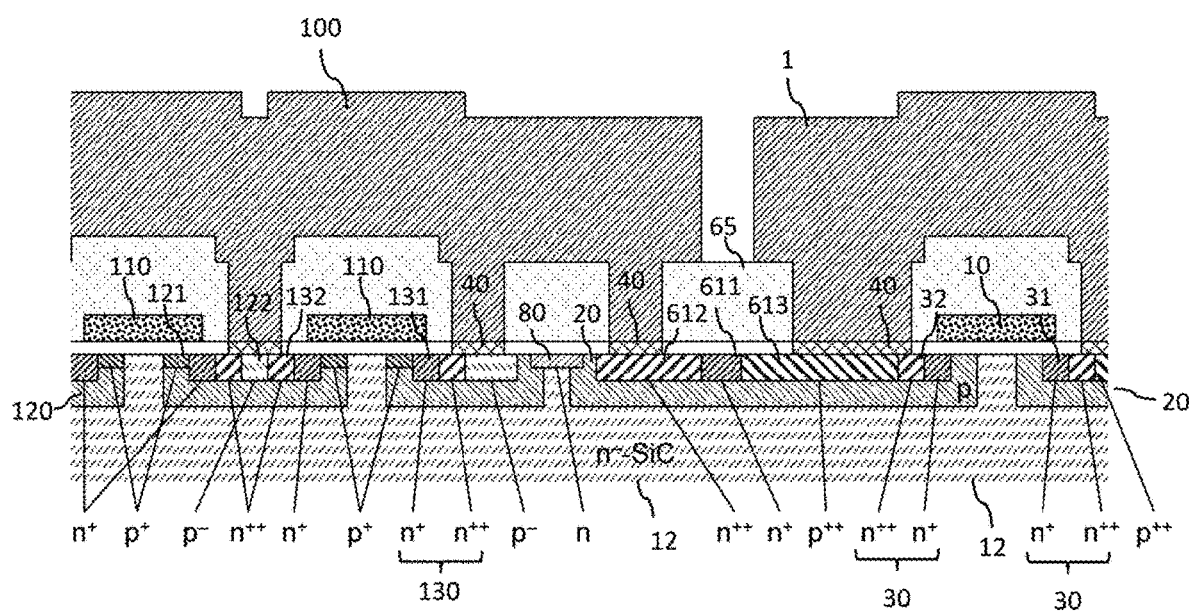
FIG. 16 is a cross-sectional view of a silicon carbide semiconductor device that may be used in a second embodiment of the present invention, taken along virtual line a2 in FIG. 20.
Figure 17:
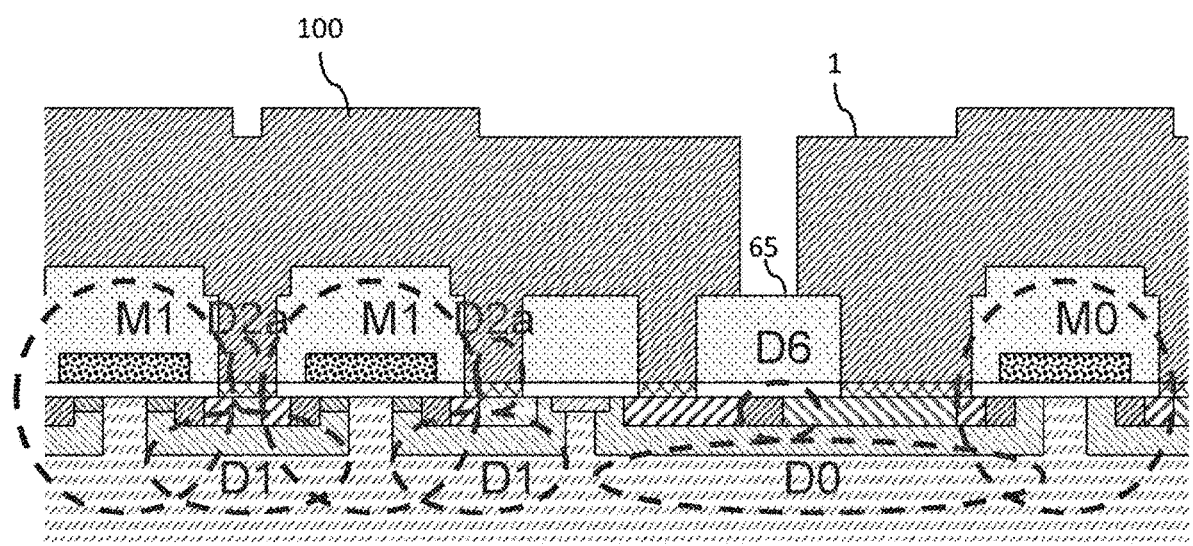
FIG. 17 is a view for explaining a function of a layer in the cross section shown in FIG. 16.
Figure 20:
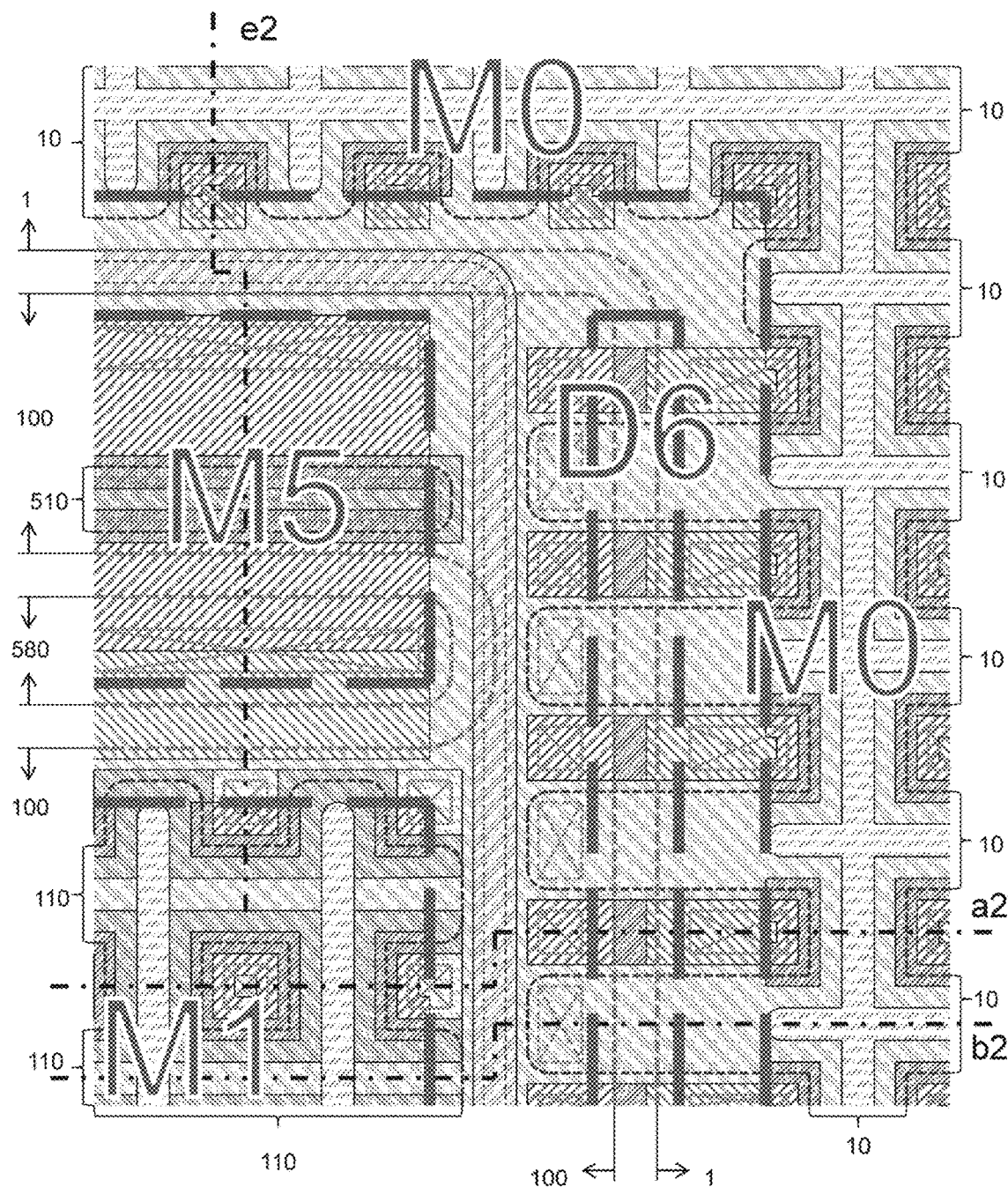
FIG. 20 is a plan view showing one aspect of a silicon carbide semiconductor device that may be used in the second embodiment of the present invention.
Figure 21:
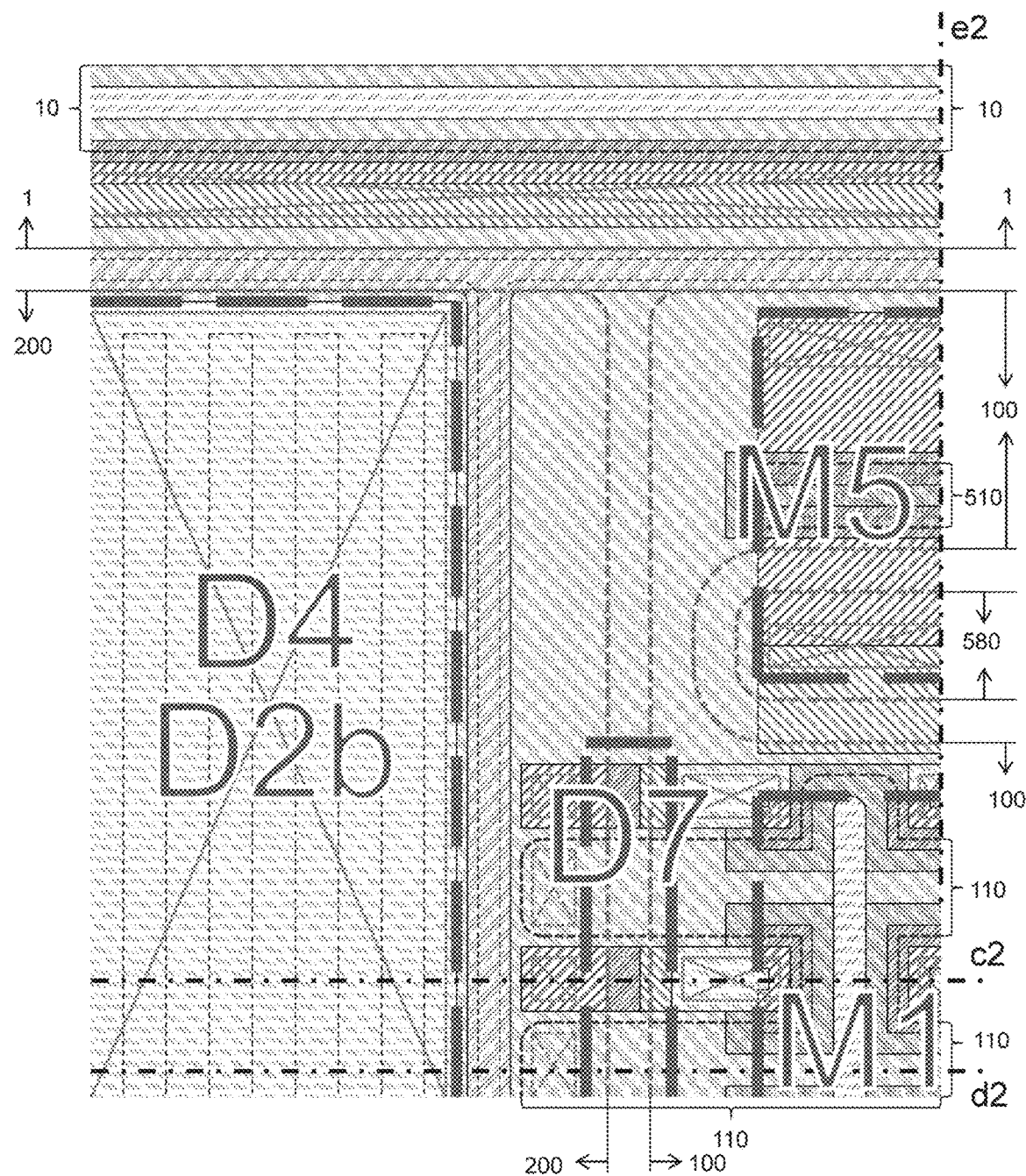
FIG. 21 is a plan view showing an aspect of a silicon carbide semiconductor device that may be used in the second embodiment of the present invention at a different location from FIG. 20.

In the present embodiment, in an in-plane direction, between a first MOSFET region (M0) below a source pad 1 and a second MOSFET region (M1) below a gate pad 100, there is provided a first protection diode region (D6) provided in a first well region 20 as shown in FIGS. 16 and 17 (see virtual line a2 in FIG. 20). Further, in the in-plane direction, between a first built-in diode region (D2b+D4) below a diode pad 200 and the second MOSFET region (M1) below the gate pad 100, there is provided a second protection diode region (D7) provided in a second well region 120 (see virtual line c2 in FIG. 21). Others are similar to those of the first embodiment, and any configuration adopted in the first embodiment can be adopted in the second embodiment. The members described in the first embodiment are described with the same reference numerals. Note that, for a cross section of virtual line b2 in FIG. 20, and virtual line d2 and virtual line e2 in FIG. 21, a similar aspect to the cross section of virtual line b1 virtual line d1, and virtual line e1 in the first embodiment can be respectively adopted.

As shown in FIGS. 16 and 17, the first protection diode region (D6) may be provided adjacent to an ultra-high-concentration n-type semiconductor region ($n^{++}$) 32 of a first source region 30 in the in-plane direction. The first protection diode region (D6) may have an ultra-high-concentration p-type semiconductor region ($p^{++}$) 613; and a high-concentration n-type semiconductor region ($n^+$) 611 provided adjacent to the ultra-high-concentration p-type semiconductor region ($p^{++}$) in the in-plane direction. Adjacent to the high-concentration n-type semiconductor region 611 in the in-plane direction, an ultra-high-concentration n-type semiconductor region ($n^{++}$) 612 may be provided. The ultra-high-concentration n-type semiconductor region ($n^{++}$) may be connected to the first gate pad 100 via a metal layer 40.

Above a joint surface between the ultra-high-concentration p-type semiconductor region 613 and the high-concentration n-type semiconductor region 611 in the first protection diode region (D6), a metal member such as a pad may not be provided. By adopting such an aspect, improvement of heat resistance can be expected.

Figure 18:
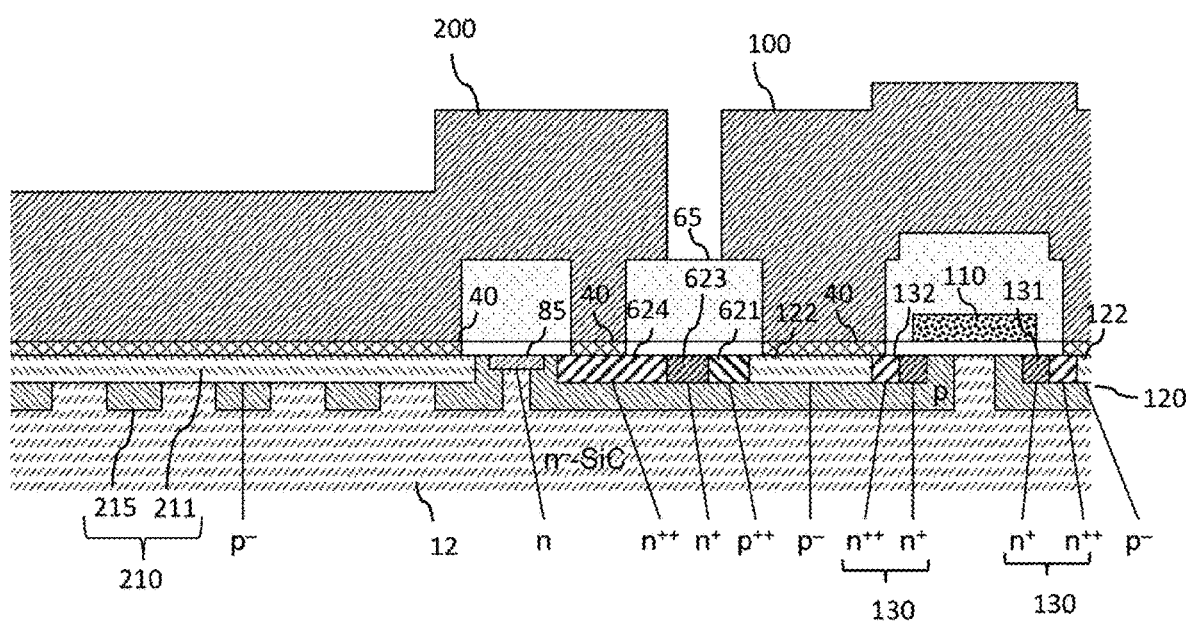
FIG. 18 is a cross-sectional view of a silicon carbide semiconductor device that may be used in the second embodiment of the present invention, taken along virtual line c2 in FIG. 21.
Figure 19:
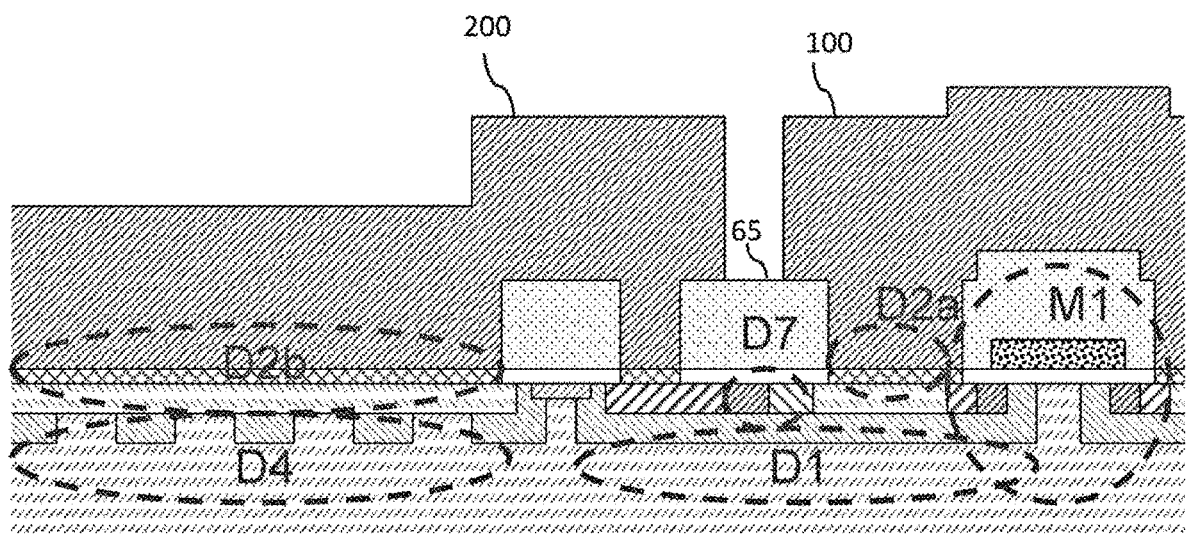
FIG. 19 is a view for explaining a function of a layer in the cross section shown in FIG. 18.

As shown in FIGS. 18 and 19, the second protection diode region (D7) may be provided adjacent to an ultra-high-concentration n-type semiconductor region ($n^{++}$) 132 of a second source region 130 in the in-plane direction with a low-concentration p-type semiconductor region ($p^-$) 122 interposed in between. The second protection diode region (D7) may have: a high-concentration p-type semiconductor region ($p^{++}$) 621; and a high-concentration n-type semiconductor region ($n^+$) 623 provided adjacent to the ultra-high-concentration p-type semiconductor region 621. Adjacent to the high-concentration n-type semiconductor region 623, an ultra-high-concentration n-type semiconductor region ($n^{++}$) 624 may be provided. The ultra-high-concentration n-type semiconductor region 624 may be connected to the diode pad 200 via the metal layer 40.

Also above a joint surface between the ultra-high-concentration p-type semiconductor region 621 and the high-concentration n-type semiconductor region 623 in the second protection diode region (D7), a metal member such as a pad may not be provided. By adopting such an aspect, improvement of heat resistance can be expected.

On the other hand, the ultra-high-concentration p-type semiconductor region 621 of the second protection diode region (D7) shown in FIG. 18 may be configured so as not to contact the gate pad 100.

In the second protection diode region (D7), an avalanche current flows through the low-concentration p-type semiconductor region 122 adjacent to the ultra-high-concentration p-type semiconductor region 621 in the second protection diode region (D7).

While a withstand voltage is lowered by widening an interval of a third lower well region 215 of the first built-in diode region (D2b+D4) shown in FIGS. 18 and 19, there is a possibility that a large avalanche energy flows into the first built-in diode region (D2b+D4) and a resistance part 400 (R3), to cause overcurrent or overvoltage in a gate drive circuit of the semiconductor device. Therefore, it is advantageous to prevent them. In addition, while there is a possibility that a gate of the first MOSFET region (M0) is also subjected to overvoltage for a similar reason, it is also advantageous to prevent this overvoltage. In this regard, in the present embodiment, since the first protection diode region (D6) is provided, it is possible to prevent overvoltage or the like at the gate of the first MOSFET region (M0).

Figure 22:
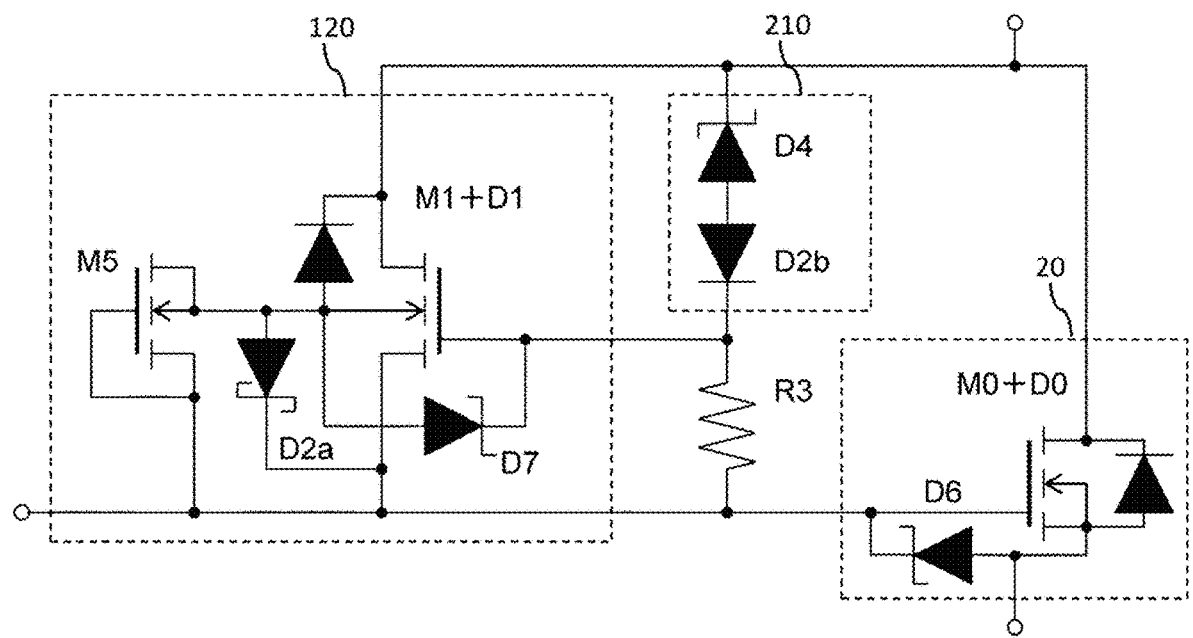
FIG. 22 is a circuit diagram of a silicon carbide semiconductor device that may be used in the second embodiment of the present invention.

Further, depending on a ratio of a value of the resistance part 400 shown as R3 in FIG. 22, to a gate input capacitance Ciss of the second MOSFET region (M1) and to a junction capacitance Cj of the third lower well region 215 of the first built-in diode region (D2b+D4), it is better to protect a gate of the second MOSFET region (M1) as well. In this regard, by providing the second protection diode region (D7) as in the present embodiment, the gate of the second MOSFET region (M1) can be protected. Note that FIG. 22 shows an aspect in which the second protection diode region (D7) is provided in the second well region 120, but the second protection diode region (D7) may be provided in the first well region 20, and an anode may have a source potential.

Third Embodiment

Hereinafter, a third embodiment of the present invention will be described.

Figure 25:
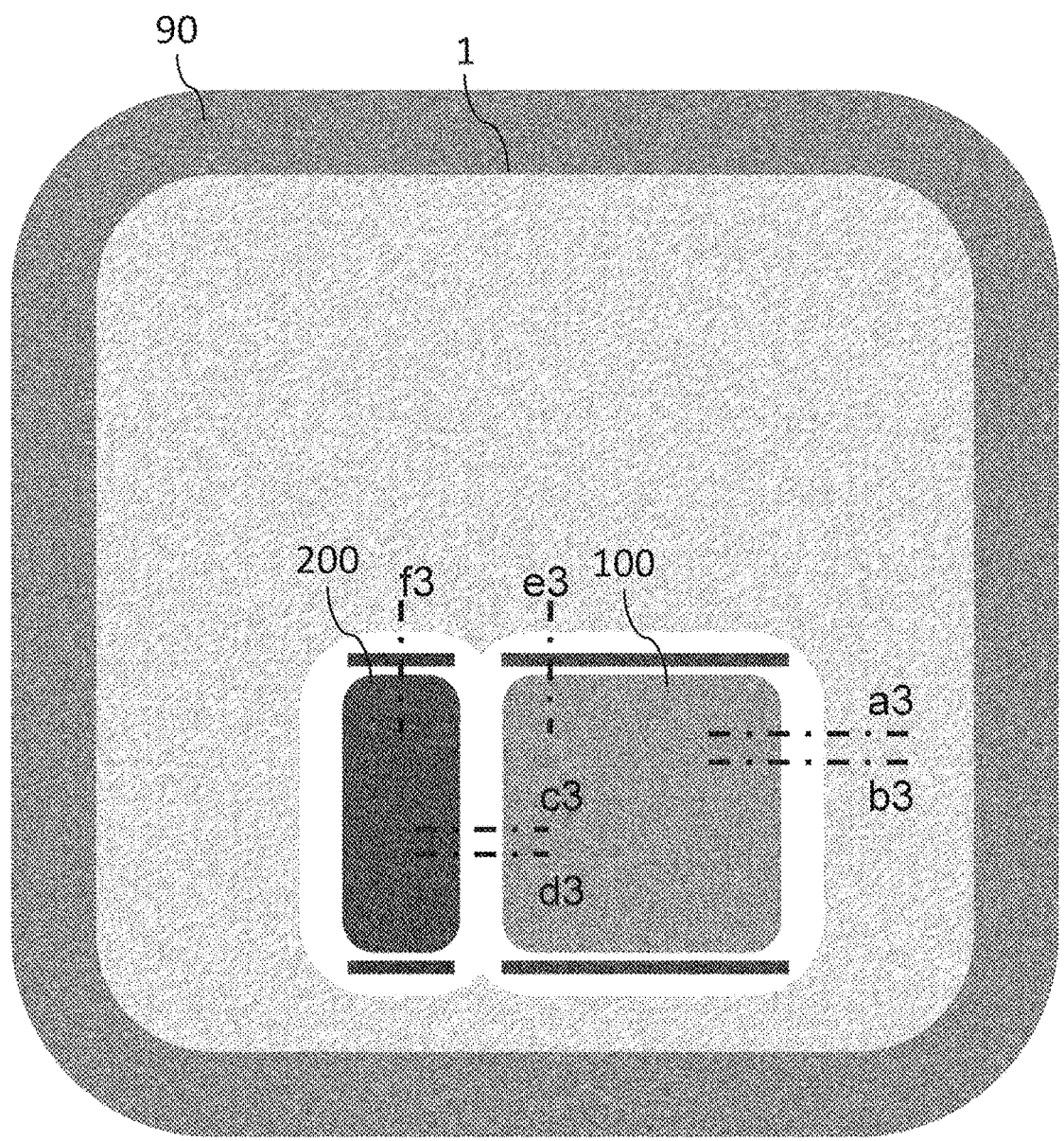
FIG. 25 is a schematic plan view of a silicon carbide semiconductor device that may be used in the third embodiment of the present invention.
Figure 26:
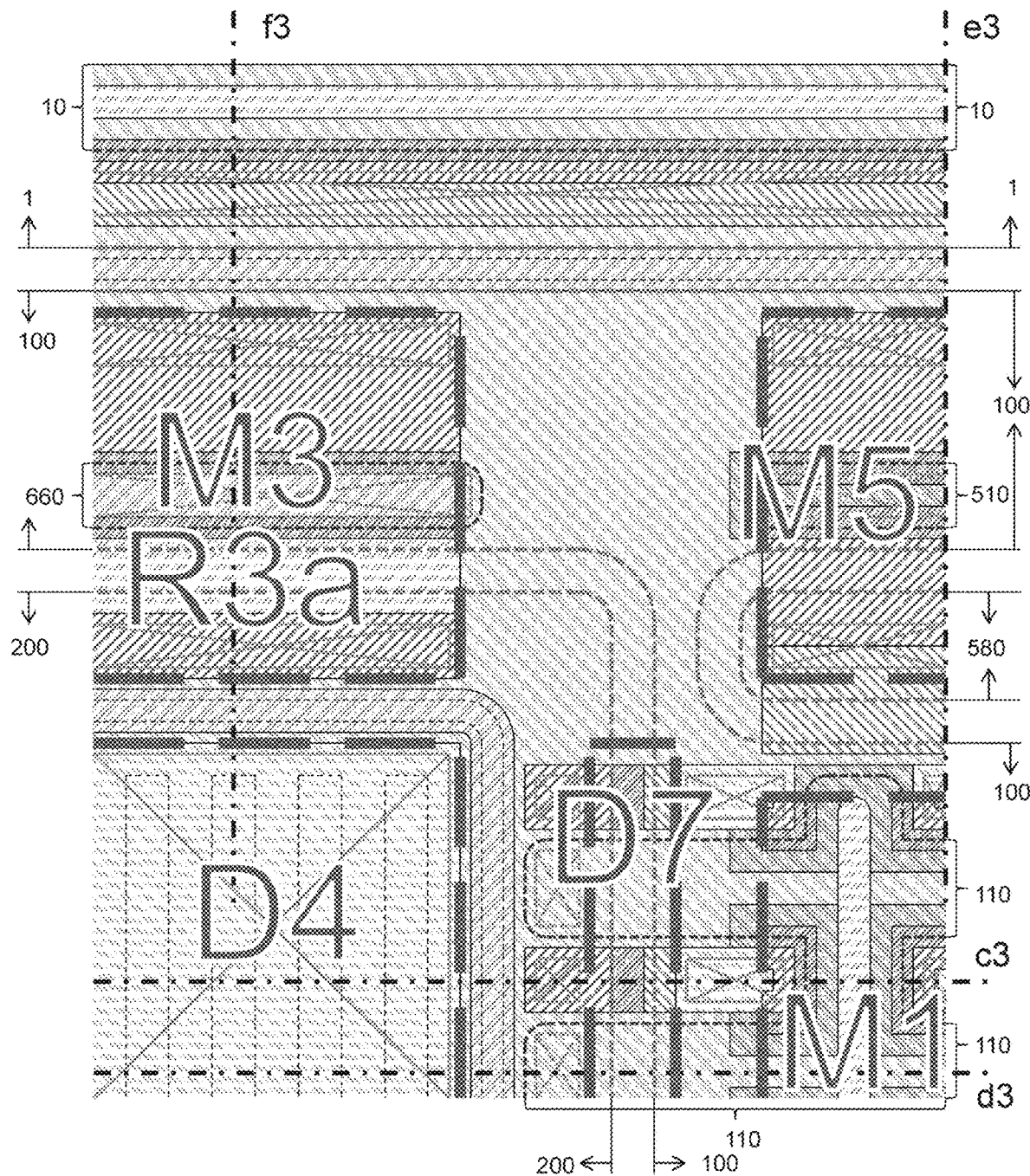
FIG. 26 is a plan view showing one aspect of a silicon carbide semiconductor device that may be used in the third embodiment of the present invention.

In each of the above embodiments, the resistance part 400 is provided. In the present embodiment, instead of a resistance part 400 or in addition to the resistance part 400, a first internal resistance region (R3a) is provided between a first built-in diode region (D2b+D4) and a first MOSFET region (M0) in an in-plane direction (see virtual line f3 in FIGS. 25 and 26). In the present embodiment, any configuration adopted in each of the above embodiments can be adopted. The members described in each of the above embodiments are described with the same reference numerals. Note that, for a cross section of virtual line a3, virtual line b3, virtual line c3, virtual line d3, and virtual line e3 in FIG. 25, it is possible to adopt an aspect similar to the cross section of virtual line air virtual line b1, virtual line c1, virtual line d1, and virtual line e1 in the first embodiment, respectively, or the cross section of virtual line a2, virtual line b2, virtual line c2, virtual line d2, and virtual line e2 in the second embodiment, respectively.

Figure 23:
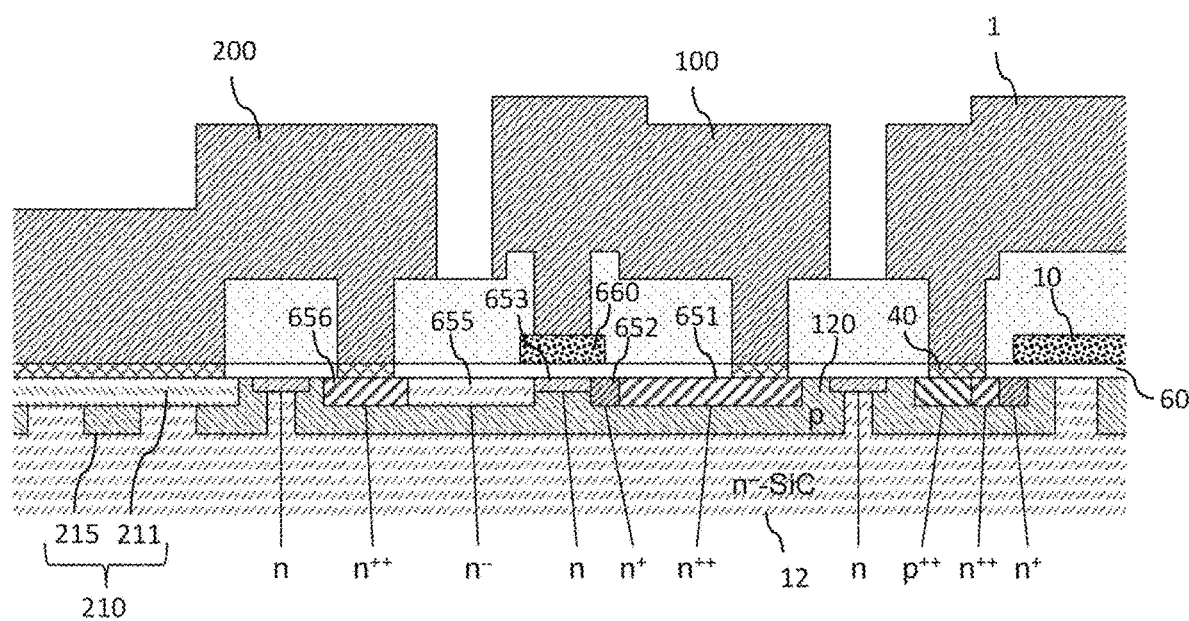
FIG. 23 is a cross-sectional view of a silicon carbide semiconductor device that may be used in a third embodiment of the present invention, taken along virtual line f3 in FIG. 26.

As shown in FIG. 23, the first internal resistance region (R3a) may have a low-concentration n-type region ($n^-$) 655 provided in a second well region 120. Adjacent to the low-concentration n-type region 655 in the in-plane direction, an ultra-high-concentration n-type region ($n^{++}$) 656 connected to a diode pad 200 via a metal layer 40 may be provided. Further, with respect to the low-concentration n-type region 655, an n-type region (n) 653 may be provided in a direction opposite to the in-plane direction of the ultra-high-concentration n-type region 656. Further, a high-concentration n-type region ($n^+$) 652 may be provided adjacent to the n-type region 653 in the in-plane direction, and an ultra-high-concentration n-type region ($n^{++}$) 651 connected to a gate pad 100 via the metal layer 40 may be provided adjacent to the high-concentration n-type region 652 in the in-plane direction.

Above the n-type region 653, a fourth gate electrode 660 may be provided via a first insulating film 60. The gate pad 100 may be provided above the fourth gate electrode 660, and the fourth gate electrode 660 and the gate pad 100 may be connected. A thickness of the n-type region 653 may be thinner than a thickness of the ultra-high-concentration n-type region 656, the low-concentration n-type region 655, the high-concentration n-type region 652, and the ultra-high-concentration n-type region 651.

A resistance of the first internal resistance region (R3a) may be realized practically by the low-concentration n-type region 655, which is a lightly doped drain (LDD) of a planar MOSFET (M3). That is, magnitude of the resistance may be adjusted by a length of the low-concentration n-type region 655, and the length of the low-concentration n-type region 655 in FIG. 23 may be longer than a length of the ultra-high-concentration n-type region 656, the low-concentration n-type region 655, the high-concentration n-type region 652, and the ultra-high-concentration n-type region 651.

Figure 24:
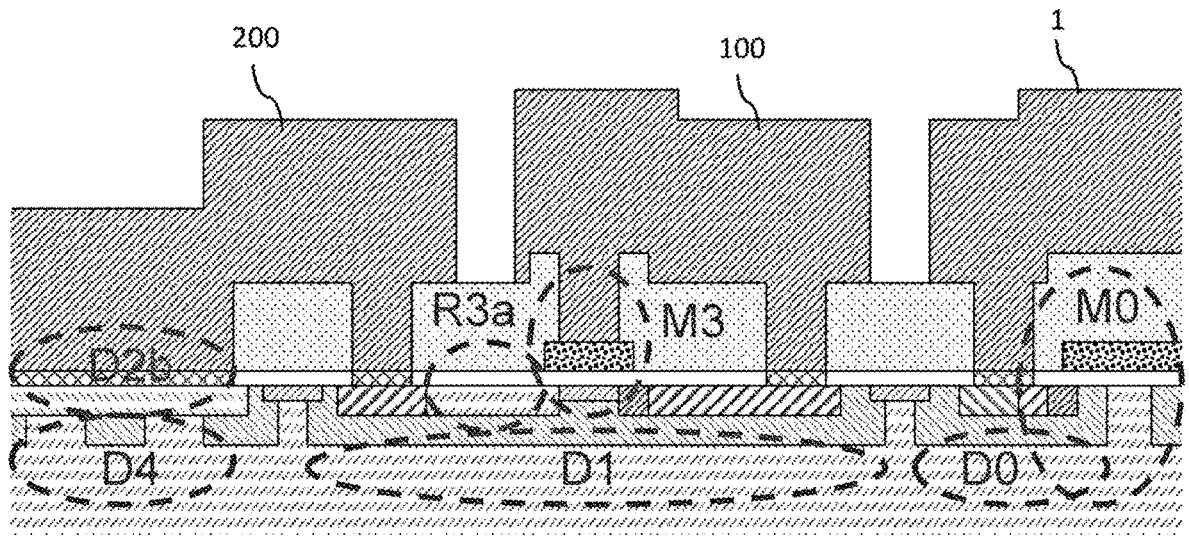
FIG. 24 is a view for explaining a function of a layer in the cross section shown in FIG. 23.

In an aspect shown in FIGS. 23 and 24, the normally-on planar MOSFET (M3) is formed, and the fourth gate electrode 660 and the ultra-high-concentration n-type region 651, which is the source region, are short-circuited by the gate pad 100.

Figure 27:
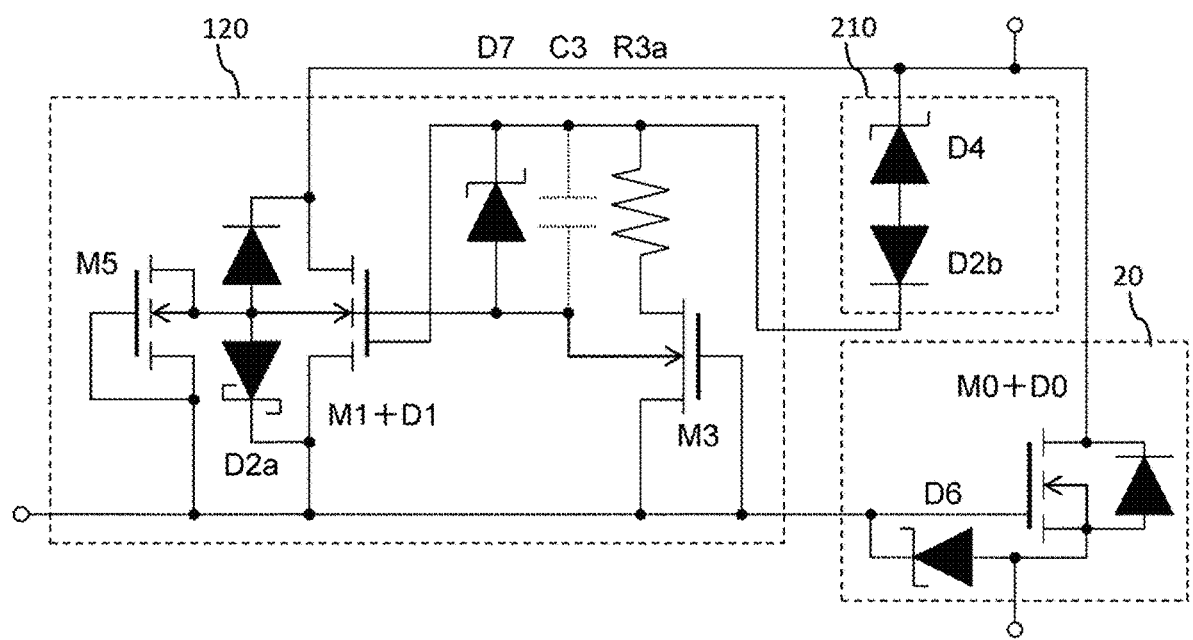
FIG. 27 is a circuit diagram of a silicon carbide semiconductor device that may be used in the third embodiment of the present invention.

In a case where the resistance part 400 is externally attached as in an aspect shown in FIG. 11, the resistance may increase as a temperature rises, and may act in a direction of lowering dV/dt. In this case, a switching loss further increases and the temperature further rises. On the other hand, by providing the first internal resistance region (R3a) and the planar MOSFET (M3) as in the present embodiment, temperature characteristics can be improved. Since interface characteristics are poor particularly when silicon carbide is used as a material, a resistance value of the MOS channel has strong negative temperature characteristics due to the influence. Therefore, it is advantageous in that the temperature characteristics are improved as compared with the case where the resistance part 400 is externally attached. Note that FIG. 27 is a circuit diagram in the present embodiment, but also shows a parasitic capacitance C3 in the first internal resistance region (R3a).

Figure 28:
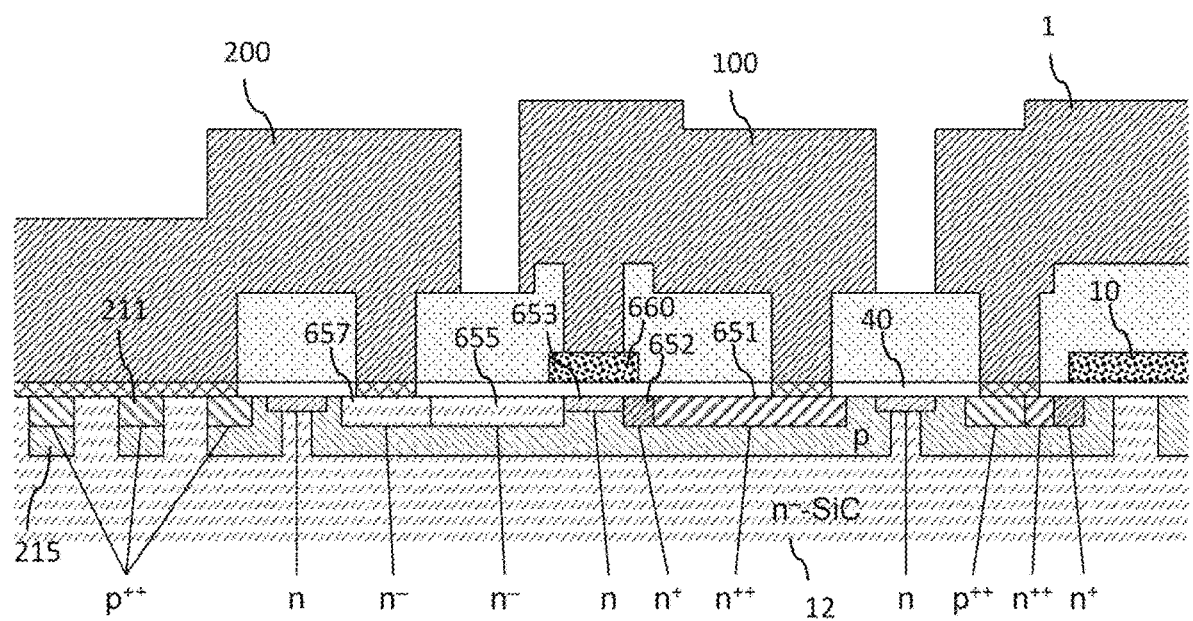
FIG. 28 is a cross-sectional view of a silicon carbide semiconductor device that may be used in the third embodiment of the present invention, taken along virtual line f3 in FIG. 26, showing an aspect different from an aspect shown in FIG. 25.
Figure 29:
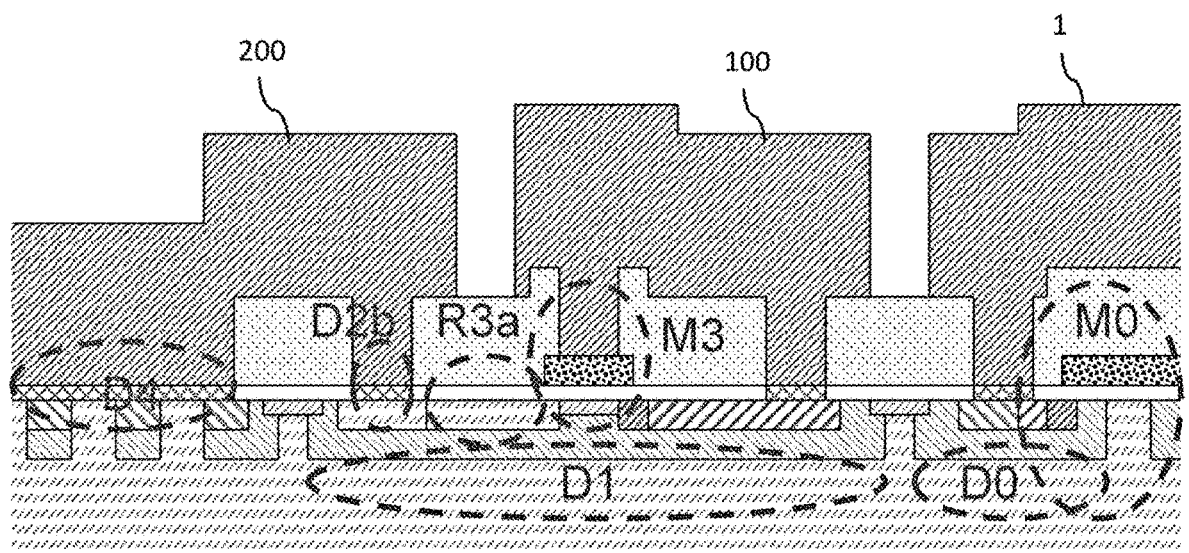
FIG. 29 is a view for explaining a function of a layer in the cross section shown in FIG. 28.

As shown in FIGS. 28 and 29, a low-concentration n-type region 657 may be provided instead of the ultra-highconcentration n-type region 656. This low-concentration n-type region 657 may be the same region having the same concentration as the low-concentration n-type region 655, or may be a region having a different concentration. When the low-concentration n-type region 657 is provided, the low-concentration n-type region 657 and the diode pad 200 may form Schottky junction via the metal layer 40, in which case it is not necessary to provide D2*b* of the first built-in diode region (D2*b*+D4) on D4. Therefore, as shown in FIGS. 23 and 29, a third upper well region 211 may have the same planar shape as a third lower well region 215, and the diode pad 200 and a drift layer 12 may form Schottky junction. In this case, a concentration of the third upper well region 211 may be equal to or higher than that of the third lower well region 215. Note that, in an aspect shown in FIGS. 23 and 29, D2*b* of the first built-in diode region (D2*b*+D4) is to be formed between the diode pad 200 and the low-concentration n-type region 657.

Fourth Embodiment

Hereinafter, a fourth embodiment of the present invention will be described.

In the present embodiment, instead of a resistance part 400 or in addition to the resistance part 400, or instead of a first internal resistance region (R3*a*) or in addition to the first internal resistance region (R3*a*), a second internal resistance region (R3*b*) is provided between a first built-in diode region (D4) below a diode pad 200 and a second MOSFET region (M1) below a gate pad 100 in an in-plane direction (see virtual line c4 and virtual line d4 in FIGS. 38 and 39). Also in the present embodiment, any configuration adopted in each of the above embodiments can be adopted in the present embodiment. The members described in each of the above embodiments are described with the same reference numerals. Note that, for a cross section of virtual line a4 and virtual line b4 in FIG. 38, an aspect similar to that of the first embodiment or the second embodiment can be adopted.

Figure 30:
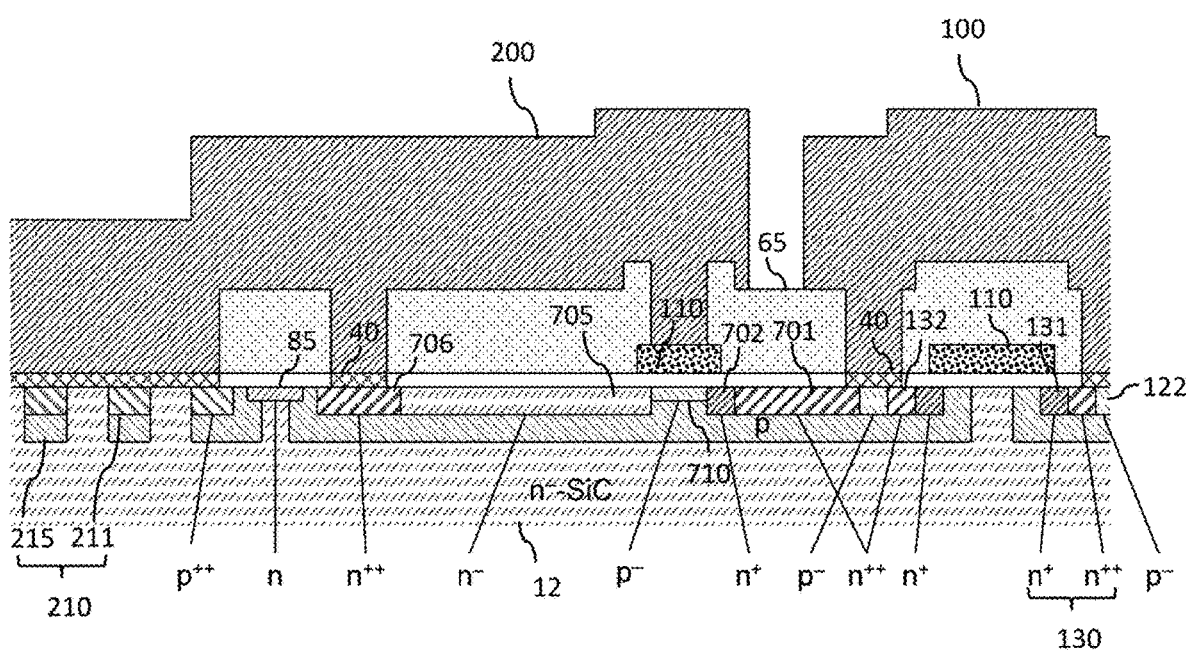
FIG. 30 is a cross-sectional view of a silicon carbide semiconductor device that may be used in a fourth embodiment of the present invention, taken along virtual line c4 in FIG. 39.
Figure 31:
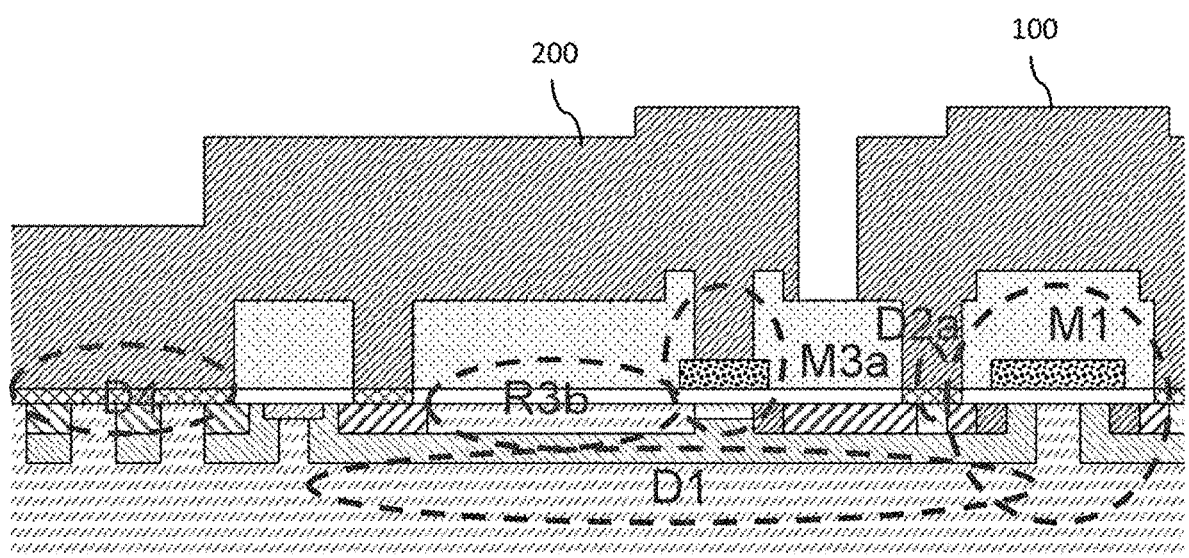
FIG. 31 is a view for explaining a function of a layer in the cross section shown in FIG. 30.
Figure 32:
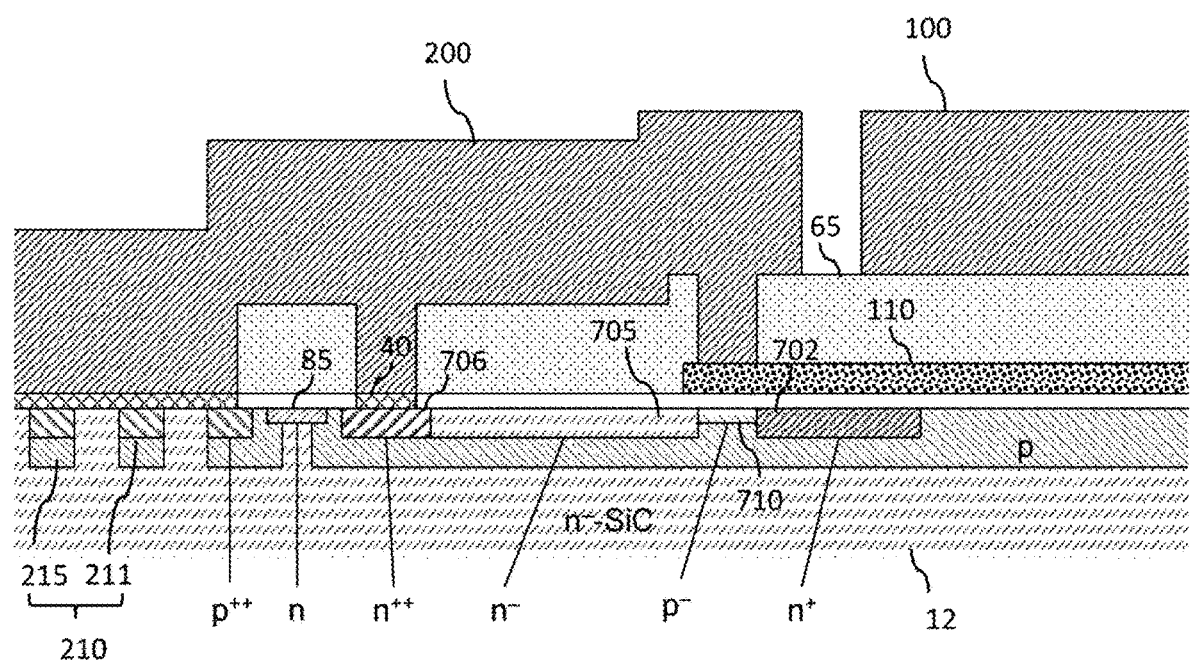
FIG. 32 is a cross-sectional view of a silicon carbide semiconductor device that may be used in the fourth embodiment of the present invention, taken along virtual line d4 in FIG. 39.
Figure 33:
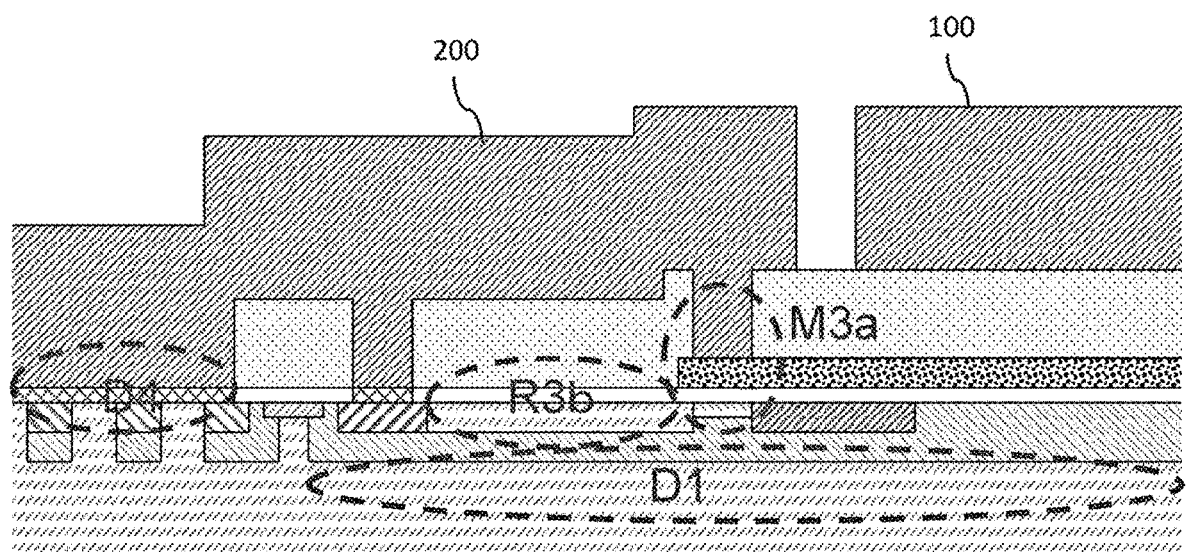
FIG. 33 is a view for explaining a function of a layer in the cross section shown in FIG. 32.

As shown in FIGS. 30 and 31, the second internal resistance region (R3*b*) may have a low-concentration n-type region (n⁻) 705 provided in a second well region 120. Adjacent to the low-concentration n-type region 705 in the in-plane direction, an ultra-high-concentration n-type region (n⁺⁺) 706 connected to the diode pad 200 via a metal layer 40 may be provided. Further, with respect to the low-concentration n-type region 705, a low-concentration p-type region (p⁻) 710 may be provided in a direction opposite to the in-plane direction of the ultra-high-concentration n-type region 706. Further, a high-concentration n-type region (n⁺) 702 may be provided adjacent to the low-concentration p-type region 710 in the in-plane direction, and an ultra-high-concentration n-type region (n⁺⁺) 701 connected to the gate pad 100 via the metal layer 40 may be provided adjacent to the high-concentration n-type region 702 in the in-plane direction.

The low-concentration n-type region 705 may be provided continuously along a predetermined direction in the in-plane direction. As an example, as shown in FIG. 39, the low-concentration n-type region 705 may extend in a vertical direction on the page of FIG. 39. In this case, the ultra-high-concentration n-type region 706 and the low-concentration p-type region 710 adjacent to the second internal resistance region (R3*b*) in the in-plane direction may be provided continuously along the predetermined direction.

As shown in FIGS. 30 to 33, above the low-concentration p-type region 710 via a first insulating film 60, a second gate electrode 110 may be provided. The diode pad 200 may be provided above the second gate electrode 110, and the second gate electrode 110 and the diode pad 200 may be connected. A thickness of the n-low-concentration p-type region 710 may be thinner than a thickness of the ultra-high-concentration n-type region 706, the low-concentration n-type region 705, the high-concentration n-type region 702, and the ultra-high-concentration n-type region 701.

A planar MOSFET (M3*a*) of the present embodiment is not normally on as in the third embodiment, but is normally off. Vth of the planar MOSFET (M3*a*) of the present embodiment can be set to s value lower than Vth of the second MOSFET region (M1). According to this aspect, D2*b* of the first built-in diode region need not be provided. In this case, as shown in FIGS. 30 to 33, a third upper well region 211 may have the same planar shape as a third lower well region 215, and may have a stripe shape extending in the in-plane direction, for example. Further, a concentration of the third upper well region 211 may be equal to or higher than that of the third lower well region 215. In this way, by adopting the aspect in which D2*b* of the first built-in diode region is not provided, D4 can be made a high withstand voltage SBD (JBS). By adopting such an aspect, a soft waveform can be obtained before entering avalanche. Further, when trying to entirely turn on, Vth of the second MOSFET region (M1) may be low since the planar MOSFET (M3*a*) is off.

Figure 34:
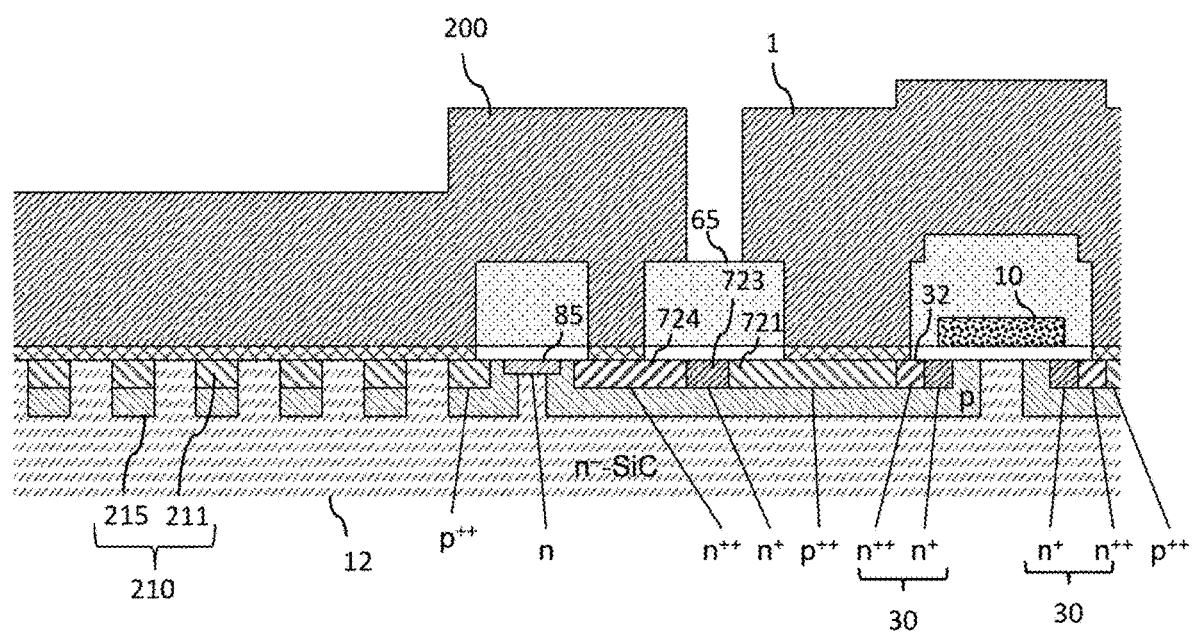
FIG. 34 is a cross-sectional view of a silicon carbide semiconductor device that may be used in the fourth embodiment of the present invention, taken along virtual line g4 in FIG. 39.
Figure 35:
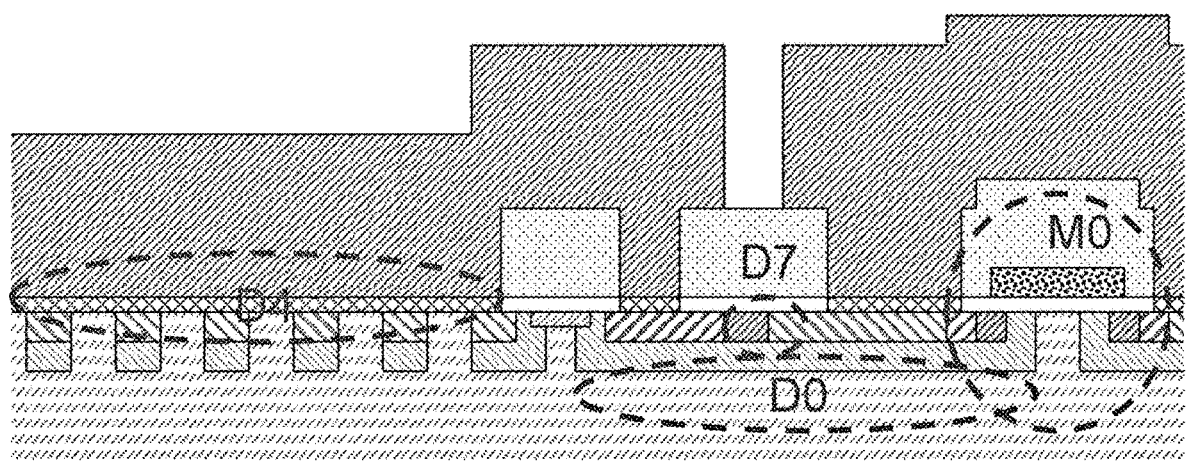
FIG. 35 is a view for explaining a function of a layer in the cross section shown in FIG. 34.

As shown in FIGS. 34 and 35, an ultra-high-concentration n-type region (n⁺⁺) 724 connected to the diode pad 200 via the metal layer 40, and a high-concentration n-type region (n⁺) 723 adjacent to the ultra-high-concentration n-type region 724 in the in-plane direction may be provided between the first built-in diode region (D4) below the diode pad 200 and the first MOSFET region (M0) below a source pad 1, and an ultra-high-concentration p-type region (p⁺⁺) 721 may be provided between the high-concentration n-type region 723 and an ultra-high-concentration n-type region (n⁺⁺) 32 of the first MOSFET region (M0) (see virtual line g4 in FIGS. 38 and 39). Then, a second protection diode region (D7) may be formed by the high-concentration n-type region 723 and the ultra-high-concentration p-type region 721. The ultra-high-concentration p-type region 721 and the ultra-high-concentration n-type region 32 of the first MOSFET region (M0) may be connected to the source pad 1 via the metal layer 40.

Figure 40:
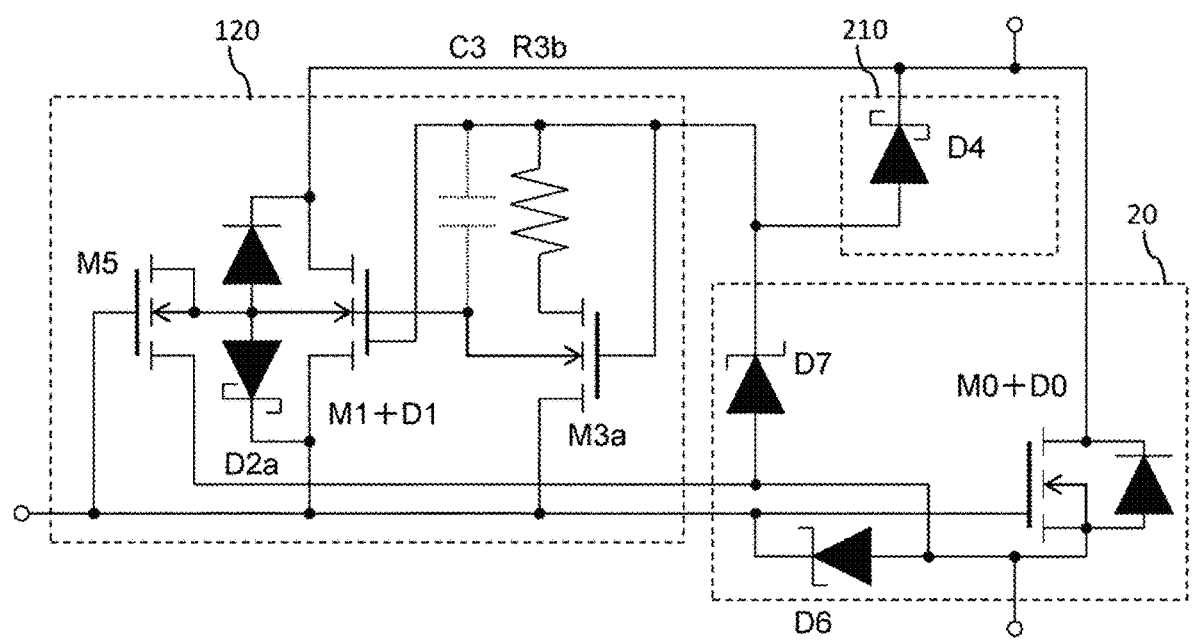
FIG. 40 is a circuit diagram of a silicon carbide semiconductor device that may be used in the fourth embodiment of the present invention.

With the above-described configuration, an anode of the second protection diode region (D7) is to be connected to a source of the first MOSFET region (M0) as shown in FIG. 40. According to this aspect, DV/dt at a time of turning off can be proportionally divided by a ratio of Cj of a first protection diode region (D6) (and/or Ciss of the second MOSFET region (M1) and the planar MOSFET (M3*a*)) to Cj of the second protection diode region (D7), and only an amount of the first protection diode region (D6) flows into the second internal resistance region (R3*b*) and the planar MOSFET (M3*a*). Therefore, even if an area of the first built-in diode region (D4) becomes considerably large, desired effective Crss can be obtained. In addition, energy when excessive avalanche occurs in the first built-in diode region (D4) can be absorbed by the first built-in diode region (D4) and the second protection diode region (D7), and it is possible to prevent overcurrent and overvoltage from reaching a gate drive circuit side.

Figure 36:
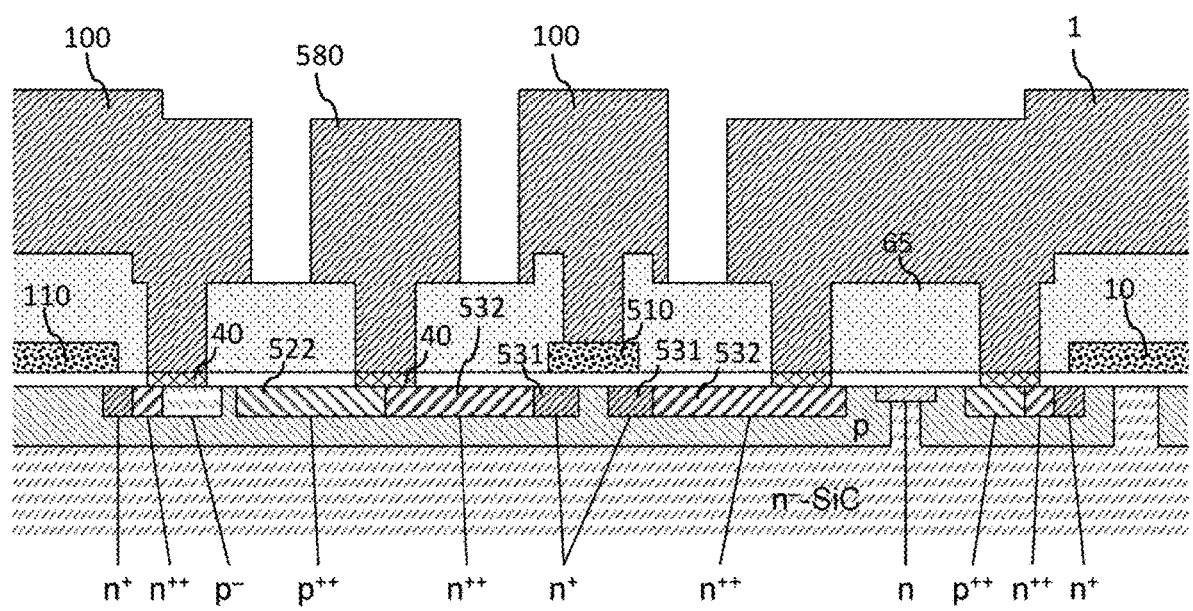
FIG. 36 is a cross-sectional view of a silicon carbide semiconductor device that may be used in the fourth embodiment of the present invention, taken along virtual line e4 in FIG. 39.
Figure 37:
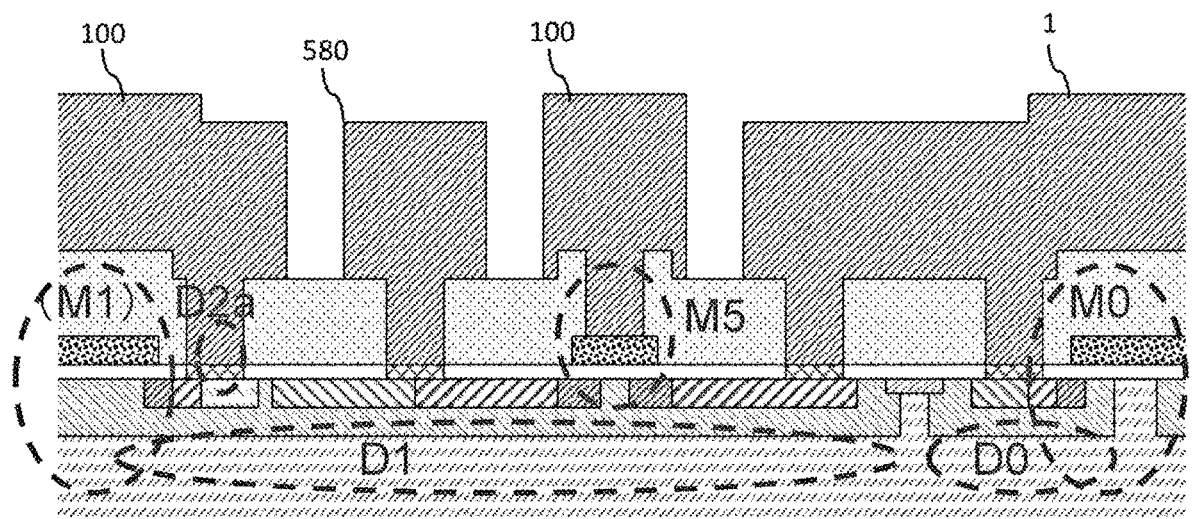
FIG. 37 is a view for explaining a function of a layer in the cross section shown in FIG. 36.
Figure 38:
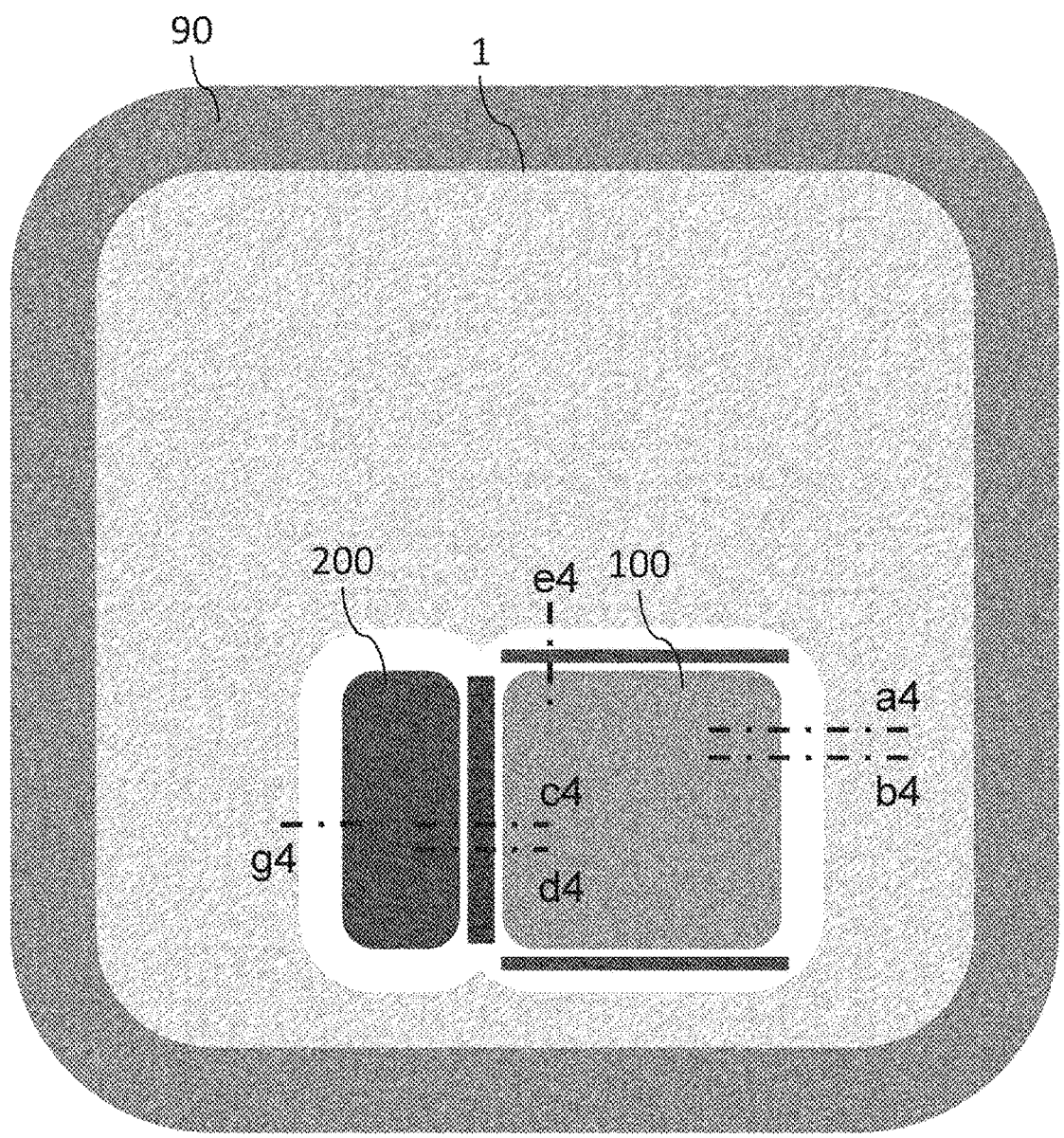
FIG. 38 is a schematic plan view of a silicon carbide semiconductor device that may be used in the fourth embodiment of the present invention.
Figure 39:
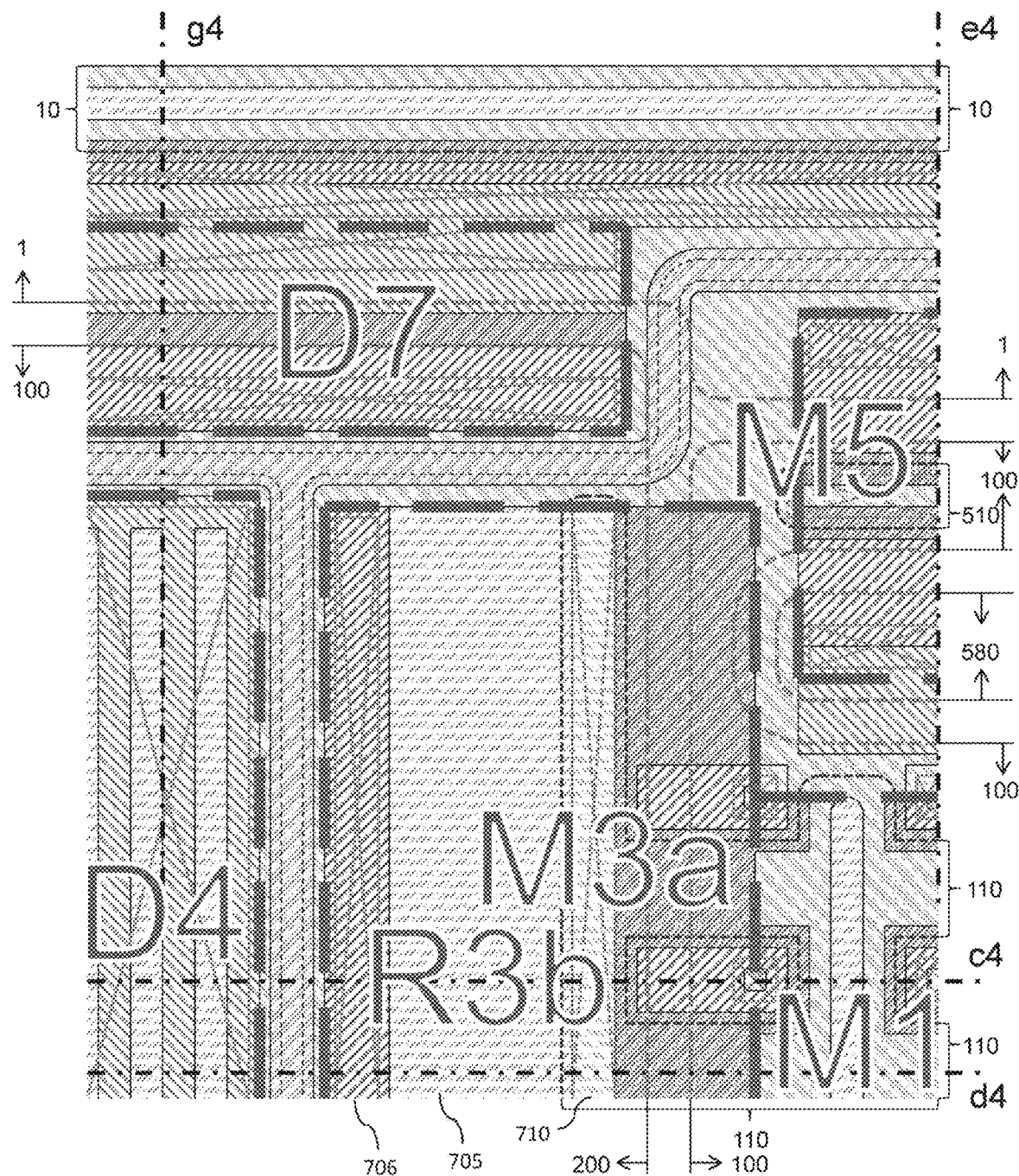
FIG. 39 is a plan view showing one aspect of a silicon carbide semiconductor device that may be used in the fourth embodiment of the present invention.

A cross section taken along virtual line e4 in FIG. 38 may be similar to that of the first embodiment, but an aspect as shown in FIGS. 36 and 37 may also be adopted. In FIGS. 36 and 37, the high-concentration p-type region (p⁺) 121 and the high-concentration p-type region (p$^{++}$) 521 in the first embodiment are not used (see FIGS. 9 and 10). This indicates that, as described above, Vth of the second MOSFET region (M1) may be low, and thus Vth of a third MOSFET region (M5) may also be low.

Fifth Embodiment

Hereinafter, a fifth embodiment of the present invention will be described.

Figure 51:
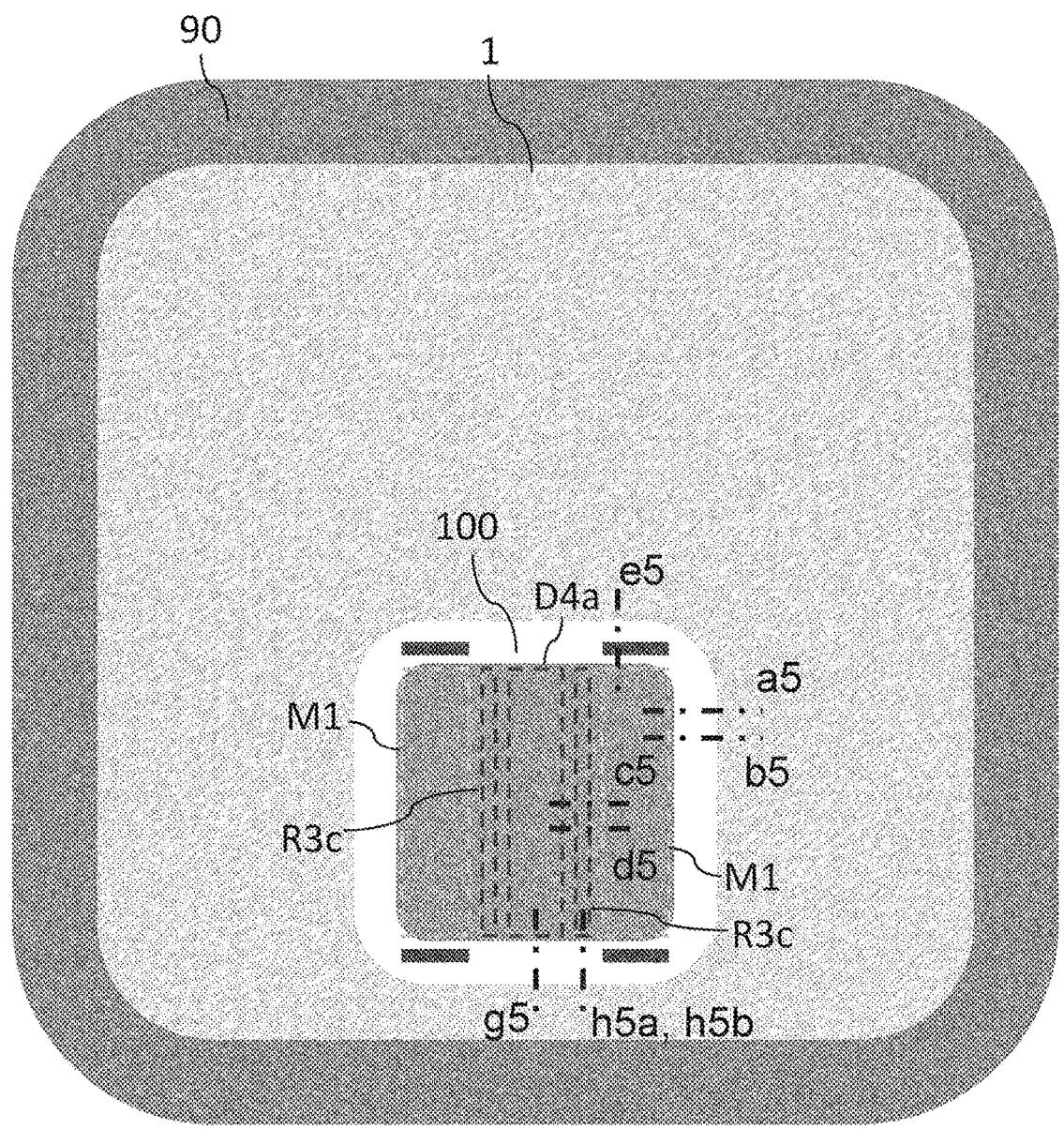
FIG. 51 is a schematic plan view of a silicon carbide semiconductor device that may be used in the fifth embodiment of the present invention.

In the present embodiment, as shown in FIGS. 41 to 44, a third internal resistance region (R3c) and a second built-in diode region (D4a) are provided below a gate pad 100 (see virtual line c5 and virtual line d5 in FIGS. 51 and 52). As an example, as shown in FIG. 51, the second built-in diode region (D4a) may be provided below the gate pad 100, a pair of second MOSFET regions (M1) may be provided on both sides (left and right in FIG. 51) in an in-plane direction of the second built-in diode region (D4a), and a pair of third internal resistance regions (R3c) may be provided between the second built-in diode region (D4a) and the second MOSFET regions (M1) in the in-plane direction. Between the second built-in diode region (D4a) and the third internal resistance region (R3c) in the in-plane direction, an n-type region (n) 95a for isolation of a second well region 120 may be provided. Also in the present embodiment, any configuration adopted in each of the above embodiments can be adopted in the present embodiment. The members described in each of the above embodiments are described with the same reference numerals.

Figure 41:
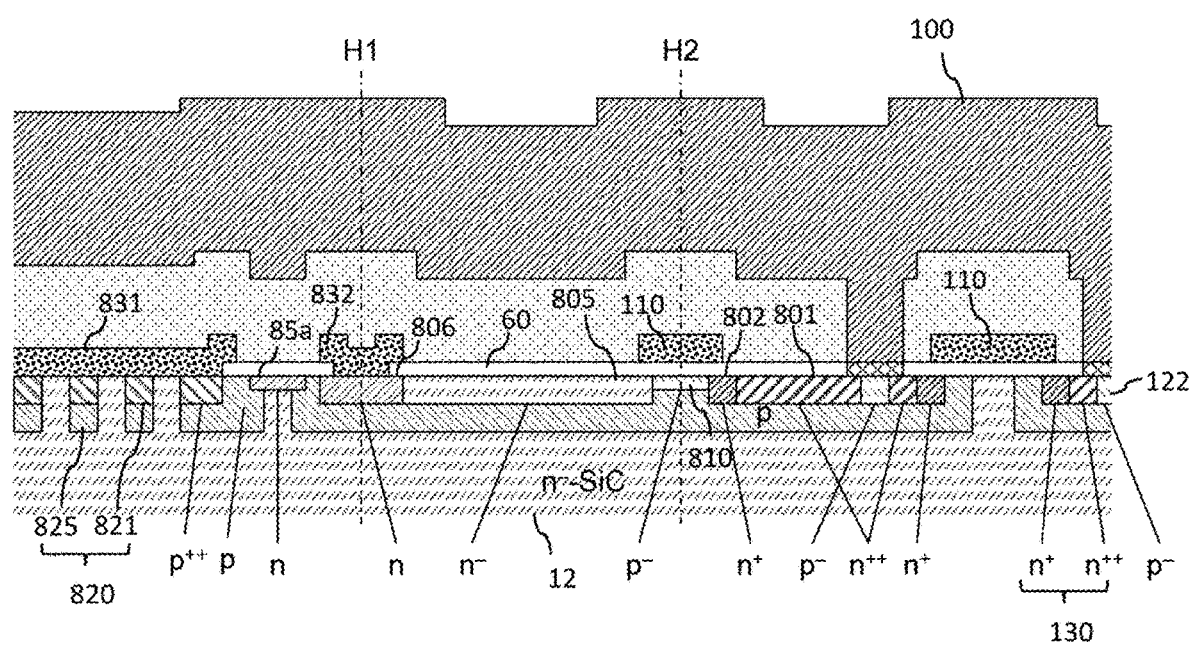
FIG. 41 is a cross-sectional view of a silicon carbide semiconductor device that may be used in a fifth embodiment of the present invention, taken along virtual line c5 in FIG. 52.
Figure 42:
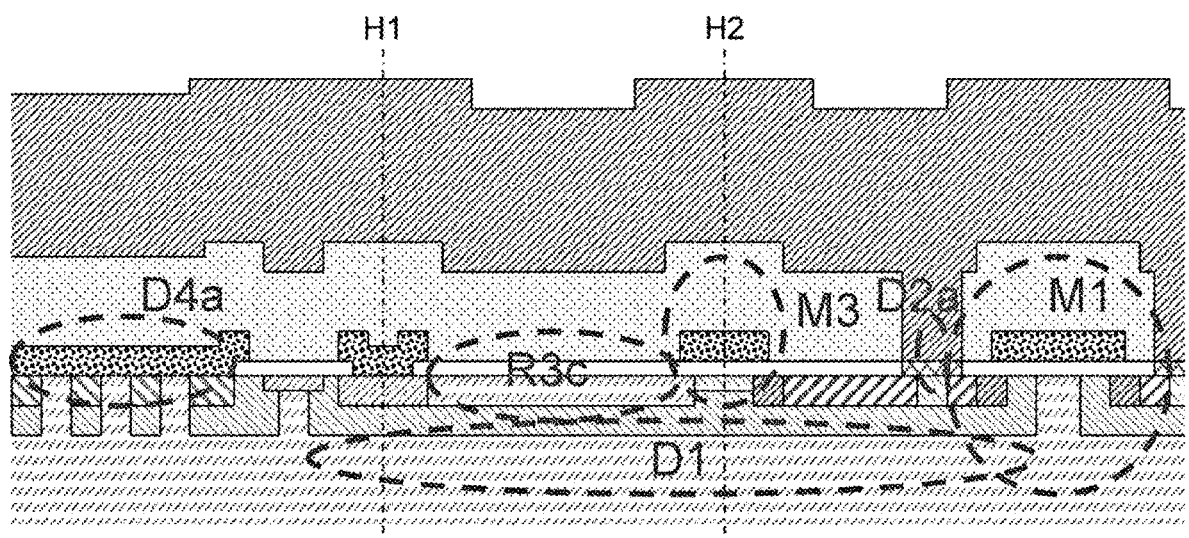
FIG. 42 is a view for explaining a function of a layer in the cross section shown in FIG. 41.
Figure 43:
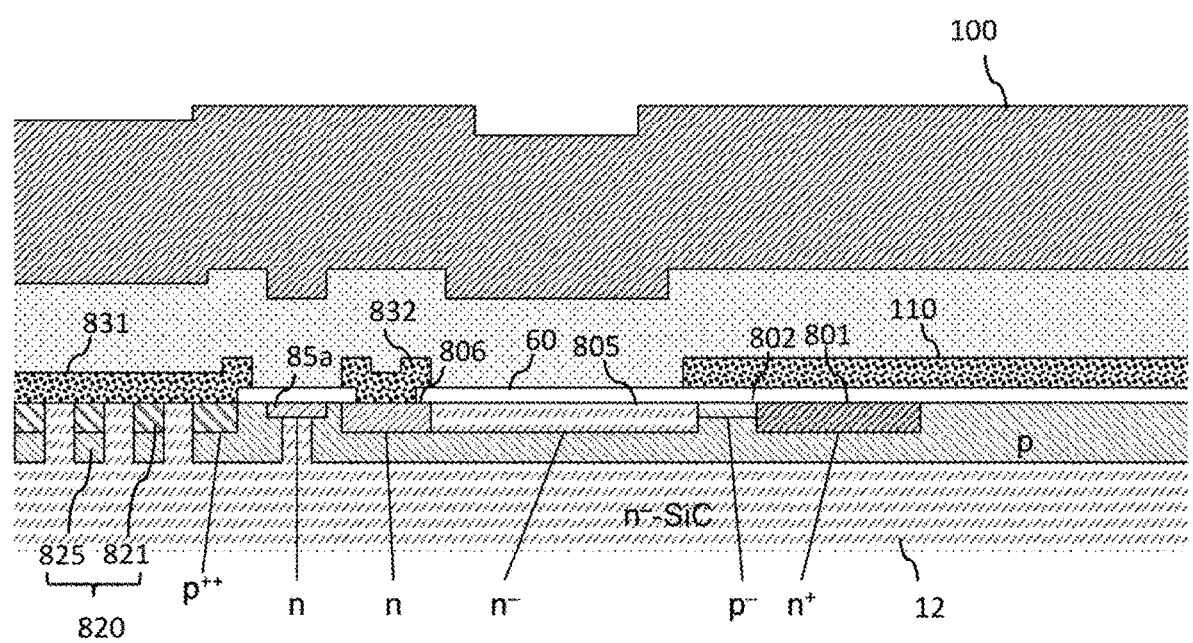
FIG. 43 is a cross-sectional view of a silicon carbide semiconductor device that may be used in the fifth embodiment of the present invention, taken along virtual line d5 in FIG. 52.
Figure 44:
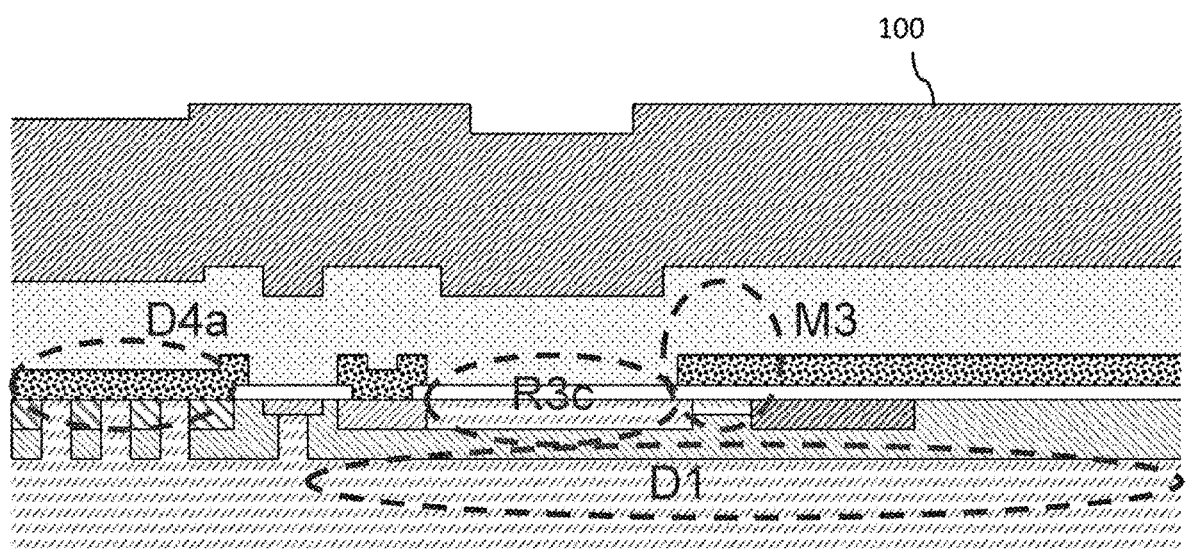
FIG. 44 is a view for explaining a function of a layer in the cross section shown in FIG. 43.

As shown in FIGS. 41 and 42, the second built-in diode region (D4a) of the present embodiment has a third well region 830. The third well region 830 may have a third lower well region 825 and a third upper well region 821 provided in the third lower well region 825. The third upper well region 821 may have a stripe shape similarly to the fourth embodiment. Further, a first connection region 831 made of polysilicon or the like may be provided above the third upper well region 821. In this case, the third upper well region 821 and a drift layer 12 are in Schottky contact with a first part 831 of the first connection region.

As described above, the third internal resistance region (R3c) may be provided between the second built-in diode region (D4a) and the second MOSFET region (M1) in the in-plane direction. The third internal resistance region (R3c) may have a low-concentration n-type region (n$^-$) 805 provided in the second well region 120, as shown in FIGS. 41 and 42. Adjacent to the low-concentration n-type region 805 in the in-plane direction, an n-type region (n) 806 may be provided on the second built-in diode region (D4a) side. Further, with respect to the low-concentration n-type region 805, a low-concentration p-type region (p$^-$) 810 may be provided in a direction opposite to the in-plane direction of the n-type region 806. Further, a high-concentration n-type region (n$^+$) 802 may be provided adjacent to the low-concentration p-type region 810 in the in-plane direction, and an ultra-high-concentration n-type region (n$^{++}$) 801 may be provided adjacent to the high-concentration n-type region 302 in the in-plane direction. A second part 832 of the first connection region made of polysilicon or the like may be provided on an upper surface of the n-type region 806.

Figure 45:
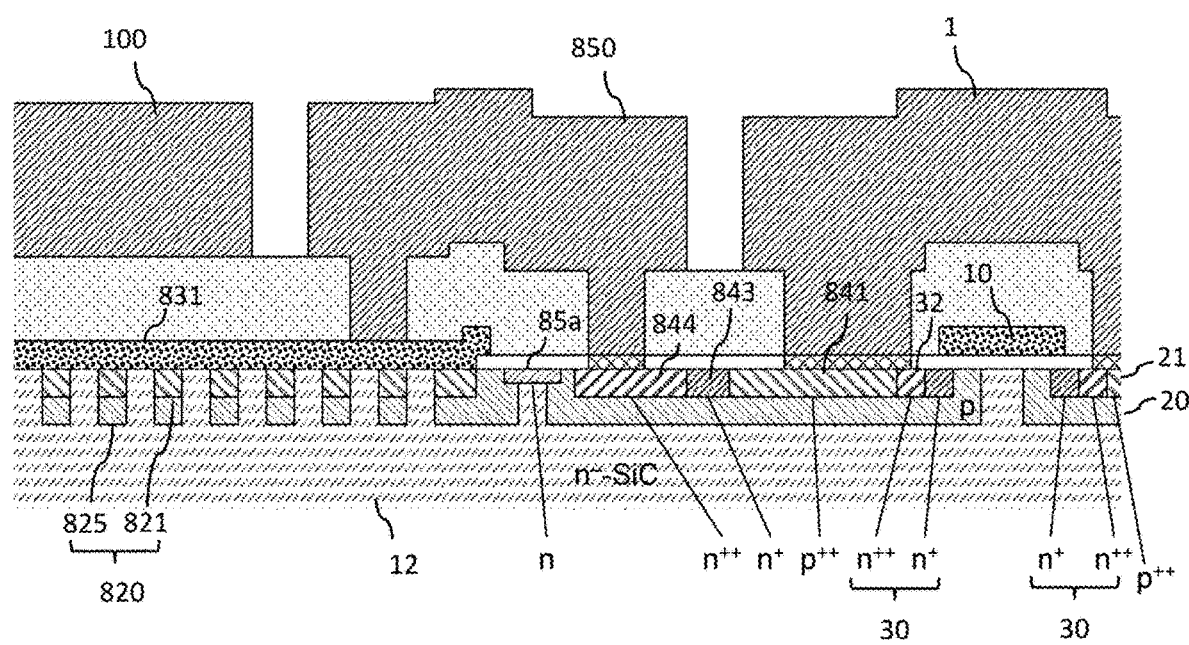
FIG. 45 is a cross-sectional view of a silicon carbide semiconductor device that may be used in the fifth embodiment of the present invention, taken along virtual line g5 in FIG. 52.
Figure 46:
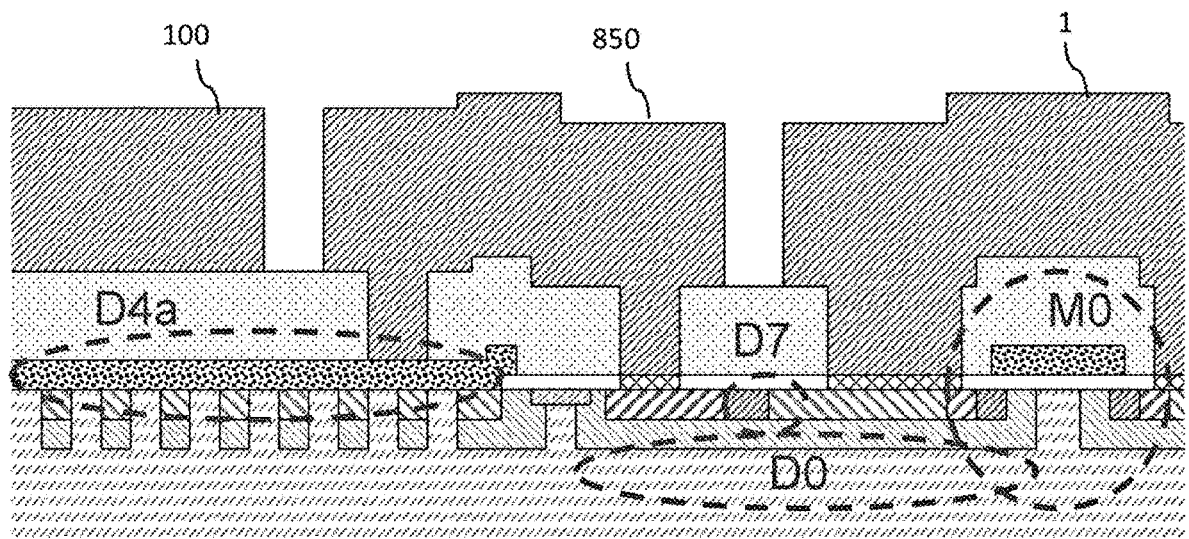
FIG. 46 is a view for explaining a function of a layer in the cross section shown in FIG. 45.
Figure 52:
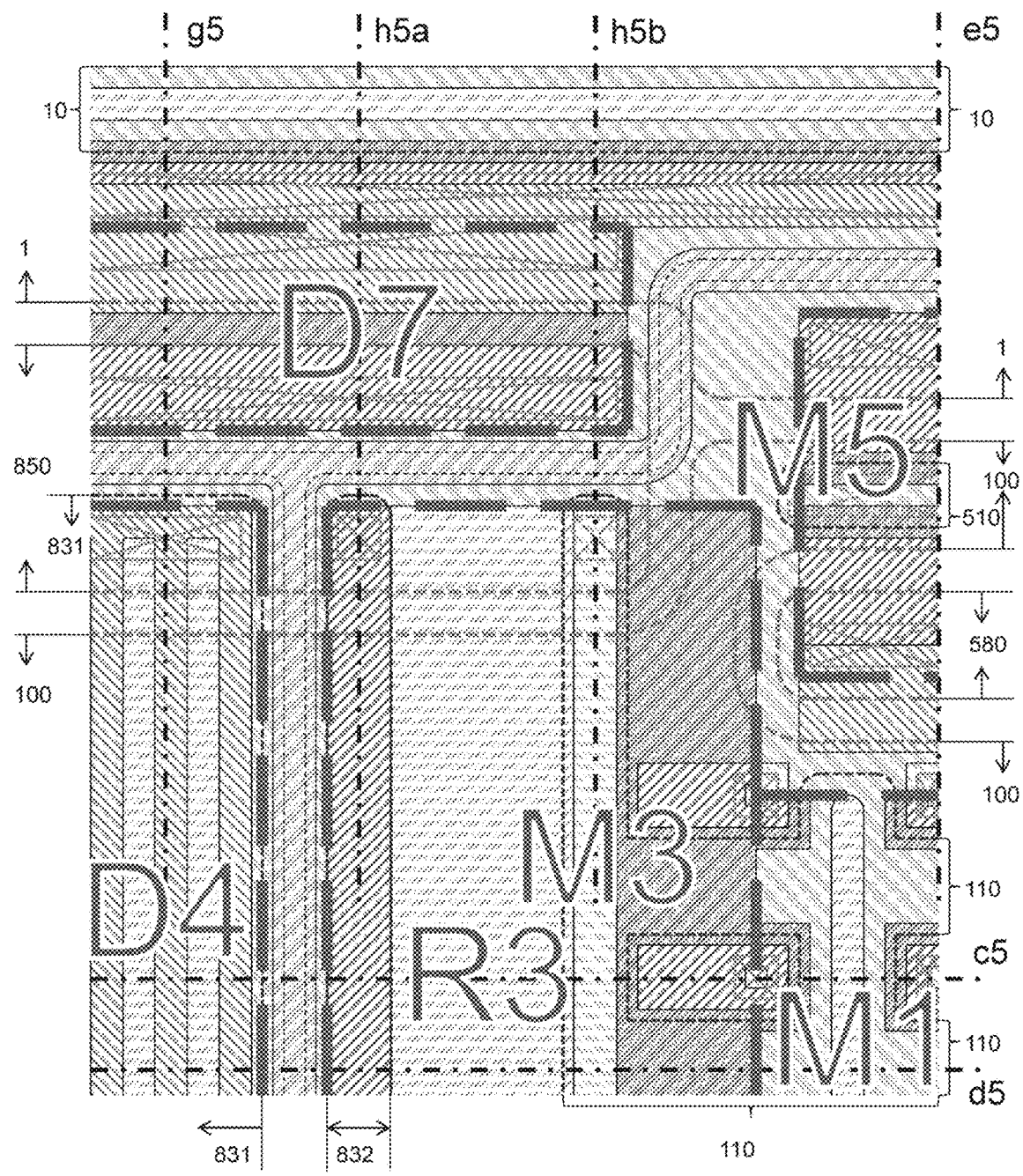
FIG. 52 is a plan view showing one aspect of a silicon carbide semiconductor device that may be used in the fifth embodiment of the present invention.

As shown in FIGS. 45 and 46, between the second built-in diode region (D4a) and a first MOSFET region (M0), there may be provided an ultra-high-concentration n-type region (n$^{++}$) 844, a high-concentration n-type region (n$^+$) 843 adjacent to the ultra-high-concentration n-type region 344 in the in-plane direction, and an ultra-high-concentration p-type region (p$^{++}$) 841 adjacent to the high-concentration n-type region (n$^+$) 843 (see virtual line g5 in FIGS. 51 and 52). Then, a second protection diode region (D7) may be formed by the high-concentration n-type region 843 and the ultra-high-concentration p-type region 841. The ultra-high-concentration p-type region (p$^{++}$) 841 may be adjacent to an ultra-high-concentration n-type region (n$^{++}$) 32 of the first MOSFET region (M0), and the ultra-high-concentration p-type region 841 and the ultra-high-concentration n-type region 32 of the first MOSFET region (M0) may be connected to a source pad 1 via a metal layer 40.

The ultra-high-concentration n-type region 844 of the second protection diode region (D7) may be connected to a second wiring layer 850 via the metal layer 40. The second wiring layer 850 may be provided above the first part 831 and the second part 832 of the first connection region provided above the third upper well region 821, and may be connected to the first part 831 and the second part 832 of the first connection region. Note that peripheral parts of the first part 331 and the second part 832 of the first connection region may be provided so as to rise on a first insulating film 60 made of a gate oxide film or the like to form a step. Below the second wiring layer 850, there may be provided the n-type region (n) 85a to isolate the third well region 830 provided with the second built-in diode region (D4a) from a first well region 20.

Figure 47:
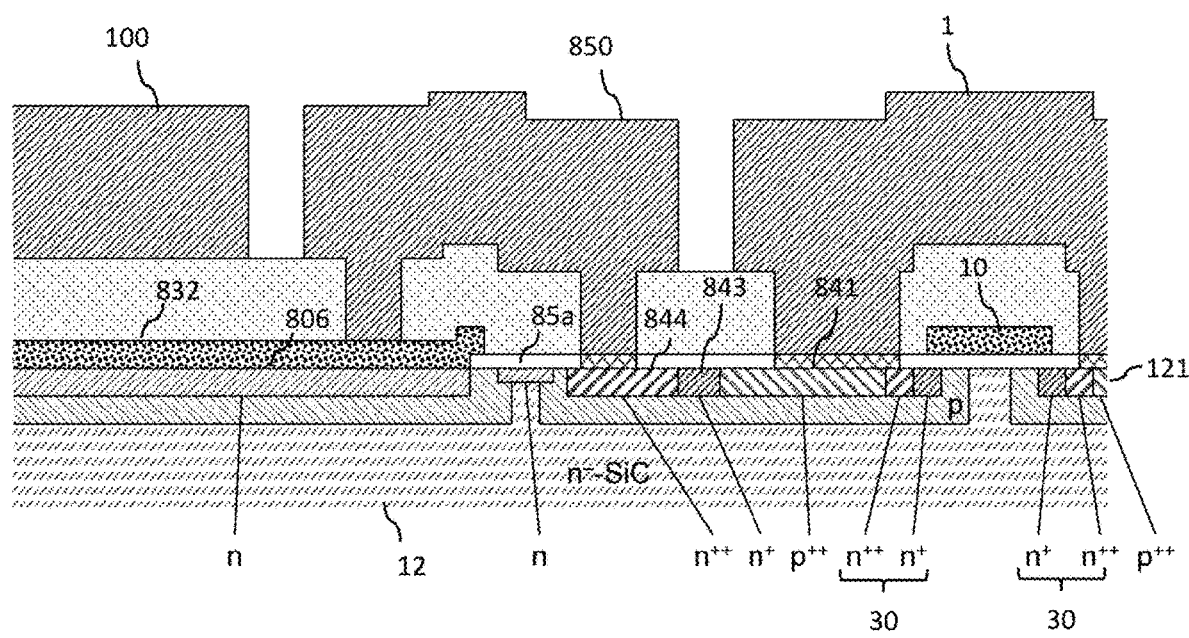
FIG. 47 is a cross-sectional view of a silicon carbide semiconductor device that may be used in the fifth embodiment of the present invention, taken along virtual line h5a in FIGS. 41 and 52.
Figure 48:
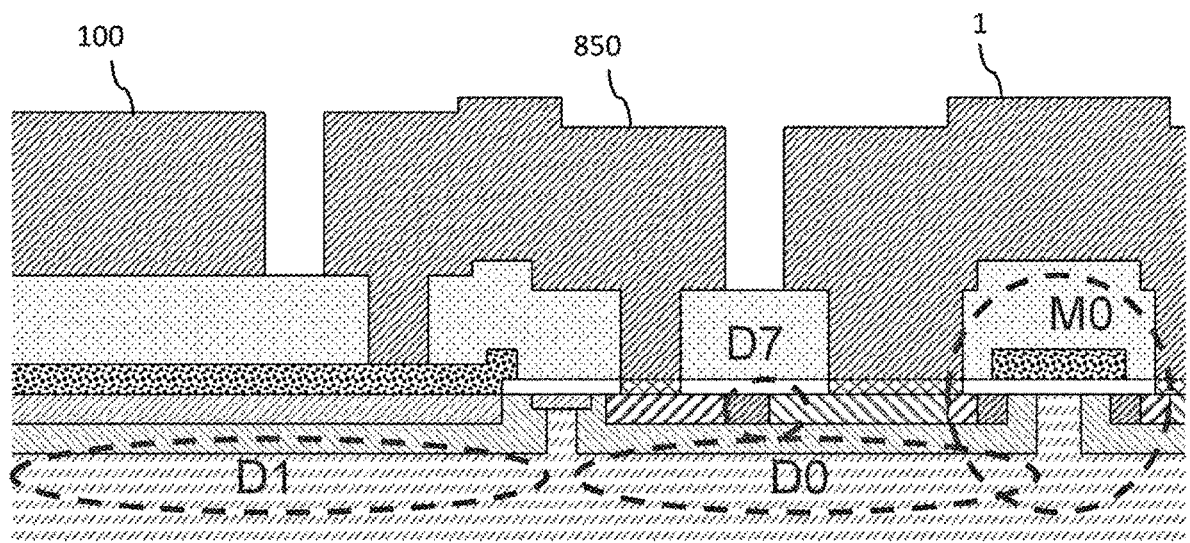
FIG. 48 is a view for explaining a function of a layer in the cross section shown in FIG. 47.
Figure 49:
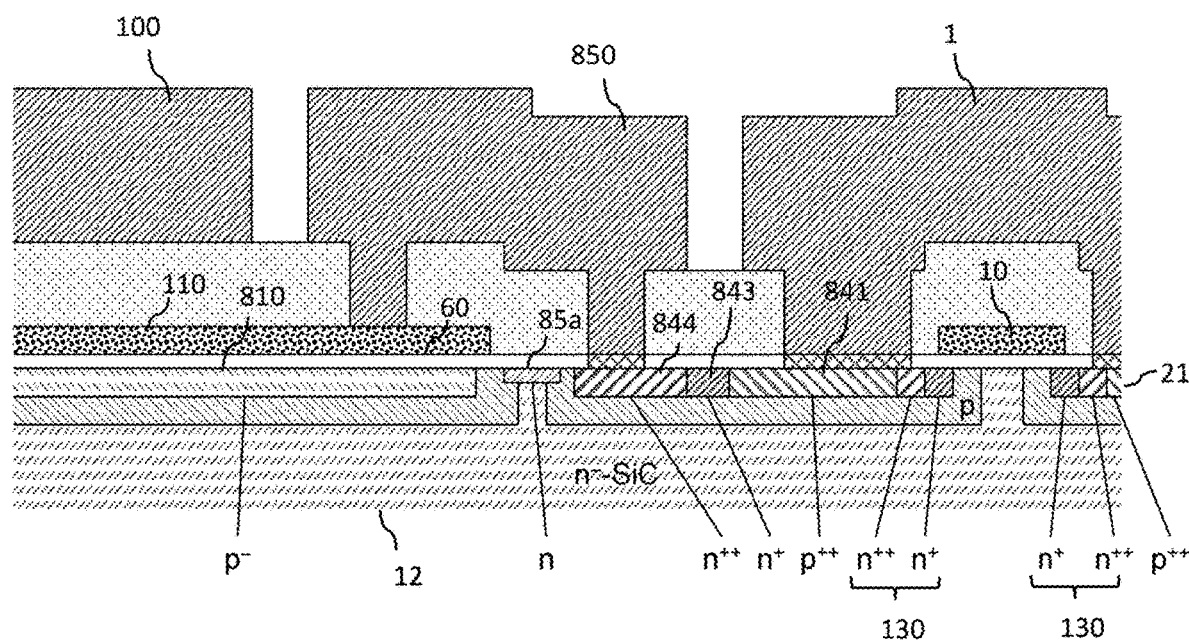
FIG. 49 is a cross-sectional view of a silicon carbide semiconductor device that may be used in the fifth embodiment of the present invention, taken along virtual line h5b in FIGS. 41 and 52.
Figure 50:
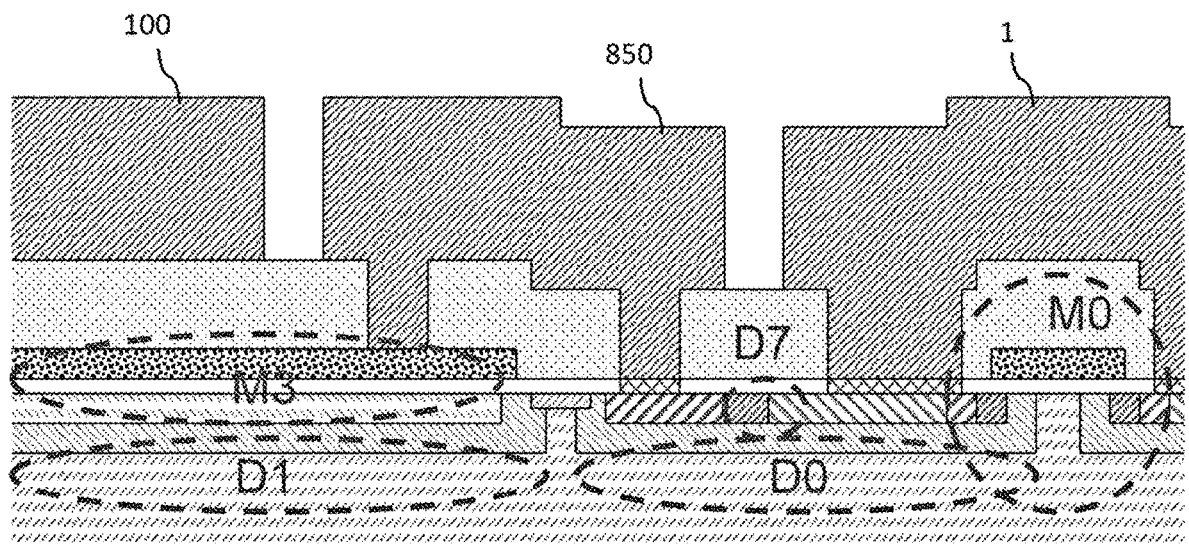
FIG. 50 is a view for explaining a function of a layer in the cross section shown in FIG. 49.

Note that a cross section of virtual line h5a in FIG. 41 is to be as shown in FIGS. 47 and 48, and a cross section of virtual line h5b in FIG. 41 is to be as shown in FIGS. 49 and 50. Further, the first part 831 and the second part 332 of the first connection region are electrically connected to a second gate electrode 110 via the second wiring layer 850. As a result, the diode region D4a is electrically connected to the second gate electrode 110 via the second wiring layer 850 and the first connection region 831.

The description of each embodiment and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the description of the claims can be appropriately changed based on the description of the specification, the drawings, and the like.

REFERENCE SIGNS LIST

1 Source pad
10 First gate electrode
11 Silicon carbide semiconductor substrate (wide gap semiconductor substrate)
12 Drift layer
20 First well region
30 First source region
100 Gate pad
110 Second gate electrode
120 Second well region
130 Second source region
200 Diode pad
211 Third upper well region
215 Third lower well region
400 Resistance part
510 Third gate electrode
D2 Diode region
D4 Diode region
D6 First protection diode region D7 Second protection diode region
M0 First MOSFET region
M1 Second MOSFET region
M5 Third MOSFET region

The invention claimed is:

1. A wide gap semiconductor device comprising:
a drift layer using a wide gap semiconductor material of a first conductivity type;
a source pad;
a first MOSFET region provided below the source pad and having a first gate electrode and a first source region provided in a first well region made of a second conductivity type;
a gate pad;
a second MOSFET region provided below the gate pad and having a second gate electrode and a second source region provided in a second well region made of a second conductivity type;
a built-in diode region electrically connected to the second gate electrode; and
a withstand voltage structure which surrounds all of the first MOSFET region, the second MOSFET region and the built-in diode region,
wherein
the second source region of the second MOSFET region is electrically connected to the gate pad.

2. The wide gap semiconductor device according to claim 1, further comprising a third MOSFET region having a third gate electrode electrically connected to the gate pad and a third source region provided in the second well region.

3. The wide gap semiconductor device according to claim 2, wherein the third MOSFET region is a planar MOSFET, and the third source region and a third drain region are provided in the second well region.

4. The wide gap semiconductor device according to claim 1, further comprising a diode pad connected to the second gate electrode, wherein
the built-in diode region is electrically connected to the second gate electrode via the diode pad.

5. The wide gap semiconductor device according to claim 4, wherein the diode pad and the gate pad are electrically connected via a resistance part.

6. The wide gap semiconductor device according to claim 4, wherein the built-in diode region has a third upper well region made of a second conductivity type and provided below the diode pad, and a third lower well region provided below the third upper well region and having an impurity concentration higher than an impurity concentration of the third upper well region.

7. The wide gap semiconductor device according to claim 6, wherein the diode pad and the third upper well region form Schottky junction.

8. The wide gap semiconductor device according to claim 1, wherein a first connection region electrically connected to the second gate electrode is provided below the gate pad.

9. The wide gap semiconductor device according to claim 8, wherein the built-in diode region electrically connected to the first connection region is provided below the first connection region.

10. A wide gap semiconductor device comprising:
a drift layer using a wide gap semiconductor material of a first conductivity type;
a source pad;
a first MOSFET region provided below the source pad and having a first gate electrode and a first source region provided in a first well region made of a second conductivity type;
a gate pad;
a second MOSFET region provided below the gate pad and having a second gate electrode and a second source region provided in a second well region made of a second conductivity type; and
a built-in diode region electrically connected to the second gate electrode, wherein the second source region of the second MOSFET region is electrically connected to the gate pad, and
in a first well region at least a part of which is provided below the gate pad, a first protection diode region electrically connected to the source pad and the gate pad is provided.

11. A wide gap semiconductor device comprising:
a drift layer using a wide gap semiconductor material of a first conductivity type;
a source pad;
a first MOSFET region provided below the source pad and having a first gate electrode and a first source region provided in a first well region made of a second conductivity type;
a gate pad;
a second MOSFET region provided below the gate pad and having a second gate electrode and a second source region provided in a second well region made of a second conductivity type;
a built-in diode region electrically connected to the second gate electrode, and
a diode pad connected to the second gate electrode, wherein
the second source region of the second MOSFET region is electrically connected to the gate pad, and
in a second well region at least a part of which is provided below the diode pad, a second protection diode region electrically connected to the diode pad and the gate pad is provided.

12. A wide gap semiconductor device comprising:
a drift layer using a wide gap semiconductor material of a first conductivity type;
a source pad;
a first MOSFET region provided below the source pad and having a first gate electrode and a first source region provided in a first well region made of a second conductivity type;
a gate pad;
a second MOSFET region provided below the gate pad and having a second gate electrode and a second source region provided in a second well region made of a second conductivity type;
a built-in diode region electrically connected to the second gate electrode; and
a diode pad connected to the second gate electrode, wherein the second source region of the second MOSFET region is electrically connected to the gate pad, and
in a first well region at least a part of which is provided below the diode pad, a second protection diode region electrically connected to the diode pad and the source pad is provided.

13. A wide gap semiconductor device comprising:
a drift layer using a wide gap semiconductor material of a first conductivity type;
a source pad;
a first MOSFET region provided below the source pad and having a first gate electrode and a first source region provided in a first well region made of a second conductivity type;

a gate pad;
a second MOSFET region provided below the gate pad and having a second gate electrode and a second source region provided in a second well region made of a second conductivity type;
a built-in diode region electrically connected to the second gate electrode; and
a diode pad connected to the second gate electrode, wherein
the second source region of the second MOSFET region is electrically connected to the gate pad, and
in a first well region at least a part of which is provided below the diode pad, a second protection diode region electrically connected to the diode pad and the source pad is provided.

14. A wide gap semiconductor device comprising:
a drift layer using a wide gap semiconductor material of a first conductivity type;
a source pad;
a first MOSFET region provided below the source pad and having a first gate electrode and a first source region provided in a first well region made of a second conductivity type;
a gate pad;
a second MOSFET region provided below the gate pad and having a second gate electrode and a second source region provided in a second well region made of a second conductivity type; and
a built-in diode region electrically connected to the second gate electrode, wherein the second source region of the second MOSFET region is electrically connected to the gate pad,
a first connection region electrically connected to the second gate electrode is provided below the gate pad, and
in a second well region located below the gate pad, a resistance region having a low-concentration first conductivity type region electrically connected to the first connection region and the gate pad is provided.

15. A wide gap semiconductor device comprising:
a drift layer using a wide gap semiconductor material of a first conductivity type;
a source pad;
a first MOSFET region provided below the source pad and having a first gate electrode and a first source region provided in a first well region made of a second conductivity type;
a gate pad;
a second MOSFET region provided below the gate pad and having a second gate electrode and a second source region provided in a second well region made of a second conductivity type; and
a built-in diode region electrically connected to the second gate electrode, wherein the second source region of the second MOSFET region is electrically connected to the gate pad,
a first connection region electrically connected to the second gate electrode is provided below the gate pad,
a second wiring layer electrically connected to the first connection region and the second gate electrode is provided between the source pad and the gate pad in an in-plane direction,
the built-in diode region is electrically connected to the second gate electrode via the second wiring layer and the first connection region, and
a second protection diode region electrically connected to the second wiring layer and the source pad is provided in a first well region at least a part of which is provided below the second wiring layer.

* * * * *